US012812930B2

(12) United States Patent
Baek et al.

(10) Patent No.: US 12,812,930 B2
(45) Date of Patent: Nov. 24, 2026

(54) 3D-STACKED SEMICONDUCTOR DEVICE INCLUDING SOURCE/DRAIN INNER SPACERS FORMED USING CHANNEL ISOLATION STRUCTURE INCLUDING THIN SILICON LAYER

(71) Applicant: SAMSUNG ELECTRONICS CO., LTD., Suwon-si (KR)

(72) Inventors: Jaejik Baek, Watervliet, NY (US); Byounghak Hong, Albany, NY (US); Inchan Hwang, Schenectady, NY (US); Kang-ill Seo, Albany, NY (US)

(73) Assignee: SAMSUNG ELECTRONICS CO., LTD. (KR)

( * ) Notice: Subject to any disclaimer, the term of this patent is extended or adjusted under 35 U.S.C. 154(b) by 853 days.

(21) Appl. No.: 17/882,203

(22) Filed: Aug. 5, 2022

(65) Prior Publication Data

US 2023/0343823 A1 Oct. 26, 2023

Related U.S. Application Data

(60) Provisional application No. 63/335,068, filed on Apr. 26, 2022.

(51) Int. Cl.
*H10D 62/10* (2025.01)
*H10D 30/67* (2025.01)
(Continued)

(52) U.S. Cl.
CPC ....... *H10D 62/121* (2025.01); *H10D 30/6757* (2025.01); *H10D 62/115* (2025.01);
(Continued)

(58) Field of Classification Search
CPC .. H10D 62/121; H10D 62/115; H10D 62/151; H10D 62/021; H10D 30/6757;
(Continued)

(56) References Cited

U.S. PATENT DOCUMENTS 10,192,867 B1 1/2019 Frougier et al.
10,840,146 B1 * 11/2020 Paul .................... H10D 84/038
(Continued)

FOREIGN PATENT DOCUMENTS

CN 114334964 A 4/2022
EP 4177938 A1 5/2023

OTHER PUBLICATIONS

Examination Report issued Sep. 14, 2023 issued by the European Patent Office for EP Patent Application No. 23164748.8.

*Primary Examiner* — Dao H Nguyen
(74) *Attorney, Agent, or Firm* — Myers Bigel, P.A.

(57) ABSTRACT

Provided is a multi-stack semiconductor device including: a substrate; a lower nanosheet transistor including a lower channel structure; a lower gate structure surrounding the lower channel structure and including a gate dielectric layer; lower source/drain regions at both ends of the lower channel structure; and at least one lower inner spacer isolating the lower source/drain regions from the lower gate structure; an upper nanosheet transistor, on the lower nanosheet transistor, including an upper channel structure; an upper gate structure surrounding the upper channel structure and including the gate dielectric layer; upper source/drain regions at both ends of the upper channel structure; and at least one upper inner spacer isolating the upper source/drain regions from the upper gate structure; and an isolation structure between the lower and upper channel structures, wherein a spacer structure including a same material forming the lower or upper inner spacer is formed at a side of the isolation structure.

20 Claims, 19 Drawing Sheets

(51) Int. Cl.

| | |
|---|---|
| ***H10D 62/13*** | (2025.01) |
| ***H10D 84/01*** | (2026.01) |
| ***H10D 84/03*** | (2025.01) |
| ***H10D 88/00*** | (2026.01) |

(52) U.S. Cl.
CPC ....... *H10D 62/151* (2025.01); *H10D 84/0128* (2025.01); *H10D 84/013* (2025.01); *H10D 84/0151* (2025.01); *H10D 84/038* (2025.01); *H10D 88/00* (2025.01)

(58) Field of Classification Search
CPC .. H10D 30/014; H10D 30/43; H10D 30/6735; H10D 84/0128; H10D 84/013; H10D 84/0151; H10D 84/038; H10D 84/85; H10D 84/0147; H10D 84/83; H10D 84/0184; H10D 84/0188; H10D 64/017
See application file for complete search history.

(56) References Cited

U.S. PATENT DOCUMENTS

| | | | | |
|---|---|---|---|---|
| 11,177,258 | B2 | 11/2021 | Xie et al. | |
| 2020/0105751 | A1* | 4/2020 | Dewey | H10D 62/235 |
| 2020/0203341 | A1 | 6/2020 | Barraud et al. | |
| 2021/0242351 | A1 | 8/2021 | Gardner et al. | |
| 2021/0376137 | A1 | 12/2021 | Yang et al. | |
| 2021/0391326 | A1 | 12/2021 | Barraud et al. | |
| 2021/0408285 | A1* | 12/2021 | Hickey | H10D 64/017 |
| 2022/0044973 | A1* | 2/2022 | Cheng | H10D 30/6757 |
| 2022/0165730 | A1* | 5/2022 | Chen | H10D 84/038 |
| 2022/0216340 | A1* | 7/2022 | Lin | H10D 84/013 |

* cited by examiner

3D-STACKED SEMICONDUCTOR DEVICE INCLUDING SOURCE/DRAIN INNER SPACERS FORMED USING CHANNEL ISOLATION STRUCTURE INCLUDING THIN SILICON LAYER

CROSS-REFERENCE TO THE RELATED APPLICATION

This application is based on and claims priority from U.S. Provisional Application No. 63/335,068 filed on Apr. 26, 2022 in the U.S. Patent and Trademark Office, the disclosure of which is incorporated herein in its entirety by reference.

BACKGROUND

1. Field

Apparatuses and methods related to the disclosure relate to a multi-stack semiconductor device including source/drain region inner spacers which are formed using an isolation structure including a thin oxide layer between an upper channel structure and a lower channel structure.

2. Description of the Related Art

Growing demand for miniaturization and improved performance of a semiconductor device has introduced a nanosheet transistor. The nanosheet transistor is characterized by a channel structure formed of one or more vertically stacked nanosheet layers bridging source/drain regions (electrodes) formed at both ends thereof in a channel length direction and a gate structure that surrounds the nanosheet layers. These nanosheet layers function as a channel for current flow between the source/drain regions of the nanosheet transistor. The nanosheet transistor is also referred to with various different names such as multi-bridge channel FET (MBCFET), nanobeam, nanoribbon, superimposed channel device, etc.

Recently, a three-dimensionally-stacked (3D-stacked) semiconductor device begins to attract an industry attention to achieve further device density. This multi-stack semiconductor device may be formed by vertically stacking two or more nanosheet stacks from a substrate, and an isolation (or separation) structure formed between a lower nanosheet transistor structure including a lower channel structure and an upper nanosheet transistor structure including an upper channel structure. Each of the lower and upper channel structures may include a plurality nanosheet layers formed of silicon-germanium (SiGe) layers and silicon (Si) layers, which are alternatingly on the substrate by, for example, epitaxially growing an SiGe layer and an Si layer in an alternating manner based on the substrate. These SiGe layers, referred to as sacrificial layers, are to be replaced by a replacement metal gate (RMG) structure in a later step of manufacturing the multi-stack semiconductor device.

The isolation structure is provided to isolate the lower and upper channel structures from each other in the multi-stack semiconductor device. For this isolation structure, a single SiGe layer or a plurality of SiGe layers having different Ge concentrations can be used. However, the inventors of the present application have identified that when a single SiGe layer or a plurality of layers having different Ge concentrations are formed as the isolation structure between the two channel structures, it is very difficult to etch the sacrificial SiGe layers of each channel structure and the SiGe layer(s) of the isolation structure from their side surfaces to obtain cavities (or grooves) for inner spacer formation therein. The inner spacers are formed to isolate the RMG structure from source/drain regions connected to the Si layers of each channel structure.

When a single SiGe layer is used as the isolation structure, the thickness difference between this SiGe layer and the SiGe layer of each channel structure makes it very difficult to deposit an inner spacer material on the cavities obtained by etching the side surfaces of these SiGe layers. In order to address this problem, a plurality of SiGe layers having different Ge concentrations has been used as the isolation structure to reduce the thickness difference and adjust the etching degree at the side surfaces of the SiGe layers. In this case, however, it is very difficult to get satisfactory etch selectivity for an SiGe layer with a low concentration of Ge, e.g., 25% during removal of an SiGe layer with a high concentration of Ge, e.g., 50%. For example, in an isolation structure including high SiGe concentration layers having 50% Ge and low SiGe concentration layers having 25% Ge that are alternatingly stacked, when the high Ge-concentration SiGe layers are etched at their side surfaces for inner spacer formation, the low Ge-concentration SiGe layers may also be etched without enduring the etch selectivity for the $1^{st}$ SiGe layers. Thus, in the SiGe isolation structure, a proper structural profile that can sufficiently receive the inner spacer formation may collapse.

Thus, there is demand for a multi-stack semiconductor device including source/drain region inner spacers formed based on an improved channel isolation structure.

Information disclosed in this Background section has already been known to or derived by the inventors before or during the process of achieving the embodiments of the present application, or is technical information acquired in the process of achieving the embodiments. Therefore, it may contain information that does not form the prior art that is already known to the public.

SUMMARY

The disclosure provides a multi-stack semiconductor device having an improved isolation structure between lower and upper channel structures and inner spacers formed based on the isolation structure, and a method of manufacturing the same.

According to an embodiment, there is provided a multi-stack semiconductor device which may include: a substrate; a lower nanosheet transistor including a lower channel structure; a lower gate structure surrounding the lower channel structure and including a gate dielectric layer; lower source/drain regions at both ends of the lower channel structure; and at least one lower inner spacer isolating the lower source/drain regions from the lower gate structure; an upper nanosheet transistor, on the lower nanosheet transistor, including an upper channel structure; an upper gate structure surrounding the upper channel structure and including the gate dielectric layer; upper source/drain regions at both ends of the upper channel structure; and at least one upper inner spacer isolating the upper source/drain regions from the upper gate structure; and an isolation structure between the lower and upper channel structures, wherein a spacer structure including a same material forming the lower or upper inner spacer is formed at a side of the isolation structure.

According to an embodiment, there is provided a multi-stack semiconductor device which may include: a substrate; a lower nanosheet transistor including a lower channel structure; a lower gate structure surrounding the lower channel structure; lower source/drain regions at both ends of the lower channel structure; and at least one lower inner spacer isolating the lower source/drain regions from the lower gate structure; an upper nanosheet transistor, on the lower nanosheet transistor, including: an upper channel structure; an upper gate structure surrounding the upper channel structure; upper source/drain regions at both ends of the upper channel structure; and at least one upper inner spacer isolating the upper source/drain regions from the upper gate structure; and an isolation structure between the lower and upper channel structures, wherein the isolation structure includes at least a portion of a gate dielectric layer included in the lower and upper gate structures.

According to embodiments, there is provided a method of manufacturing a multi-stack semiconductor device. The method may include: (a) providing, on a substrate, a nanosheet stack including: a lower channel structure including at least one lower sacrificial layer and at least one lower channel layer; an isolation structure, on the lower nanosheet stack, including at least one sacrificial isolation layer and at least one channel isolation layer; and an upper channel structure, on the isolation layer; including at least one upper sacrificial layer and at least one upper channel layer; (b) forming a dummy gate structure on the nanosheet stack; (c) forming cavities at side surfaces of the lower sacrificial layer, the sacrificial isolation layer and the upper sacrificial layer; (d) forming an inner spacer at the cavities; (e) forming lower source/drain regions and upper source/drain regions connected to the lower channel layer and the upper channel layer, respectively; and (f) replacing the dummy gate structure, the lower and upper sacrificial layers, and at least a portion of the sacrificial isolation layer with a gate structure, wherein, in operation (d), a spacer structure including a same material forming the inner spacer is formed at a side of the isolation structure.

BRIEF DESCRIPTION OF DRAWINGS

Example embodiments of the inventive concept will be more clearly understood from the following detailed description taken in conjunction with the accompanying drawings in which:

FIGS. 1A and 1B through FIGS. 11A and 11B illustrates a method for manufacturing a multi-stack semiconductor device having an improved isolation structure between lower and upper channel structures and inner spacers formed based on the isolation structure, according to an embodiment;

DETAILED DESCRIPTION OF EXAMPLE EMBODIMENTS

Figure 1A:
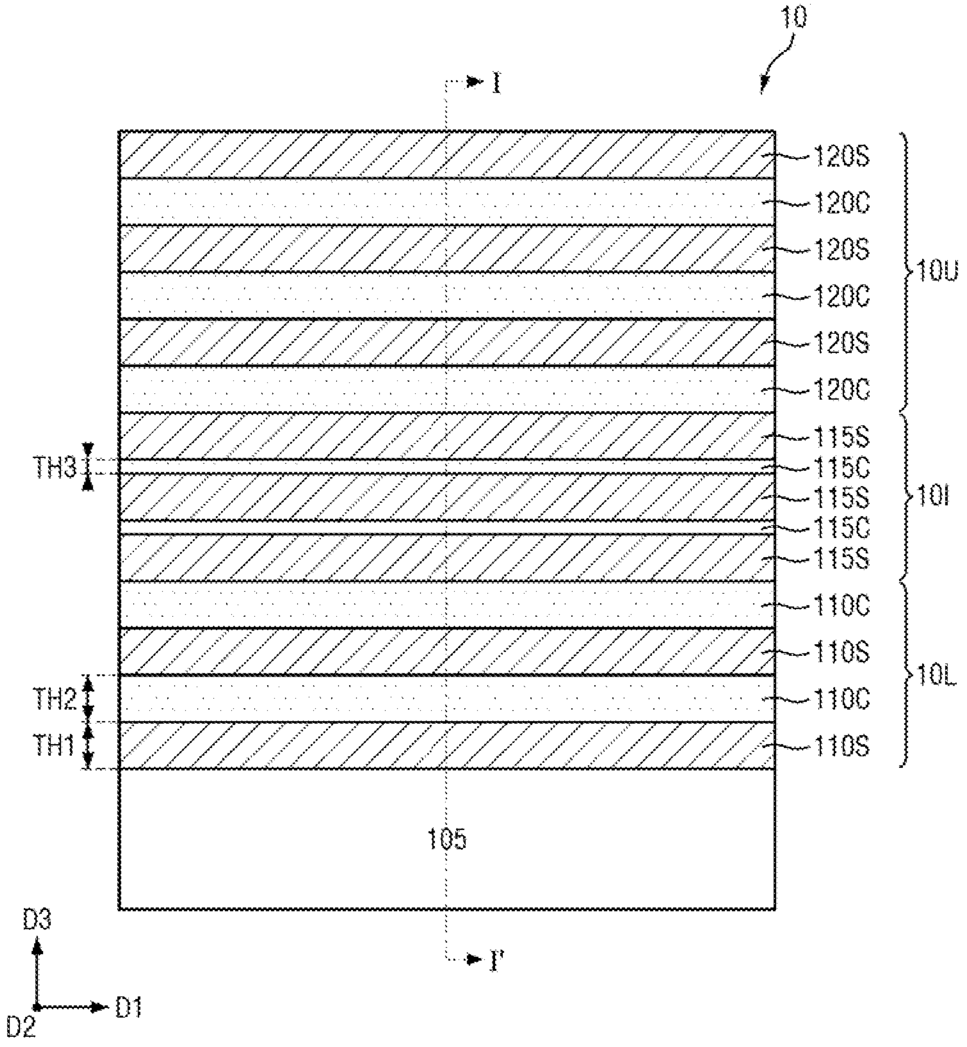

The embodiments described herein are all example embodiments, and thus, the disclosure is not limited thereto, and may be realized in various other forms. Each of the embodiments provided in the following description is not excluded from being associated with one or more features of another example or another embodiment also provided herein or not provided herein but consistent with the disclosure. For example, even if matters described in a specific example or embodiment are not described in a different example or embodiment thereto, the matters may be understood as being related to or combined with the different example or embodiment, unless otherwise mentioned in descriptions thereof. In addition, it should be understood that all descriptions of principles, aspects, examples, and embodiments of the disclosure are intended to encompass structural and functional equivalents thereof. In addition, these equivalents should be understood as including not only currently well-known equivalents but also equivalents to be developed in the future, that is, all devices invented to perform the same functions regardless of the structures thereof. For example, channel layers, sacrificial layers, sacrificial isolation layers and channel isolation layers described herein may take a different type or form as long as the disclosure can be applied thereto.

It will be understood that when an element, component, layer, pattern, structure, region, or so on (hereinafter collectively "element") of a semiconductor device is referred to as being "over," "above," "on," "below," "under," "beneath," "connected to" or "coupled to" another element the semiconductor device, it can be directly over, above, on, below, under, beneath, connected or coupled to the other element or an intervening element(s) may be present. In contrast, when an element of a semiconductor device is referred to as being "directly over," "directly above," "directly on," "directly below," "directly under," "directly beneath," "directly connected to" or "directly coupled to" another element of the semiconductor device, there are no intervening elements present. Like numerals refer to like elements throughout this disclosure.

Spatially relative terms, such as "over," "above," "on," "upper," "below," "under," "beneath," "lower," and the like, may be used herein for ease of description to describe one element's relationship to another element(s) as illustrated in the figures. It will be understood that the spatially relative terms are intended to encompass different orientations of a semiconductor device in use or operation in addition to the orientation depicted in the figures. For example, if the semiconductor device in the figures is turned over, elements described as "below" or "beneath" other elements would then be oriented "above" the other elements. Thus, the term "below" can encompass both an orientation of above and below. The semiconductor device may be otherwise oriented (rotated 90 degrees or at other orientations) and the spatially relative descriptors used herein interpreted accordingly.

As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c. Herein, when a term "same" is used to compare a dimension of two or more elements, the term may cover a "substantially same" dimension.

It will be understood that, although the terms $1^{st}$, $2^{nd}$, $3^{rd}$, $4^{th}$, etc. may be used herein to describe various elements, these elements should not be limited by these terms. These terms are only used to distinguish one element from another element. Thus, a $1^{st}$ element discussed below could be termed a $2^{nd}$ element without departing from the teachings of the disclosure.

It will be also understood that, even if a certain step or operation of manufacturing an apparatus or structure is described later than another step or operation, the step or operation may be performed later than the other step or operation unless the other step or operation is described as being performed after the step or operation.

Many embodiments are described herein with reference to cross-sectional views that are schematic illustrations of the embodiments (and intermediate structures). As such, variations from the shapes of the illustrations as a result, for example, of manufacturing techniques and/or tolerances, are to be expected. Thus, the embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept. Further, in the drawings, the sizes and relative sizes of layers and regions may be exaggerated for clarity.

For the sake of brevity, conventional elements, structures or layer of semiconductor devices including a nanosheet transistor may or may not be described in detail herein. For example, an etch stop layer or a barrier metal pattern formed on or in a layer or structure of a semiconductor device may be omitted herein.

Herebelow, it is understood that the term “transistor” may refer to a semiconductor device including a gate structure and source/drain regions on a substrate, and the term “transistor structure” may refer to an intermediate semiconductor device structure before at least one of the gate structure and the source/drain regions is formed to complete the semiconductor device structure as a transistor.

FIGS. 1A and 1B through FIGS. 11A and 11B illustrate a method for manufacturing a multi-stack semiconductor device having an improved isolation structure between lower and upper channel structures and inner spacers formed based on the isolation structure, according to an embodiment.

Figure 1B:
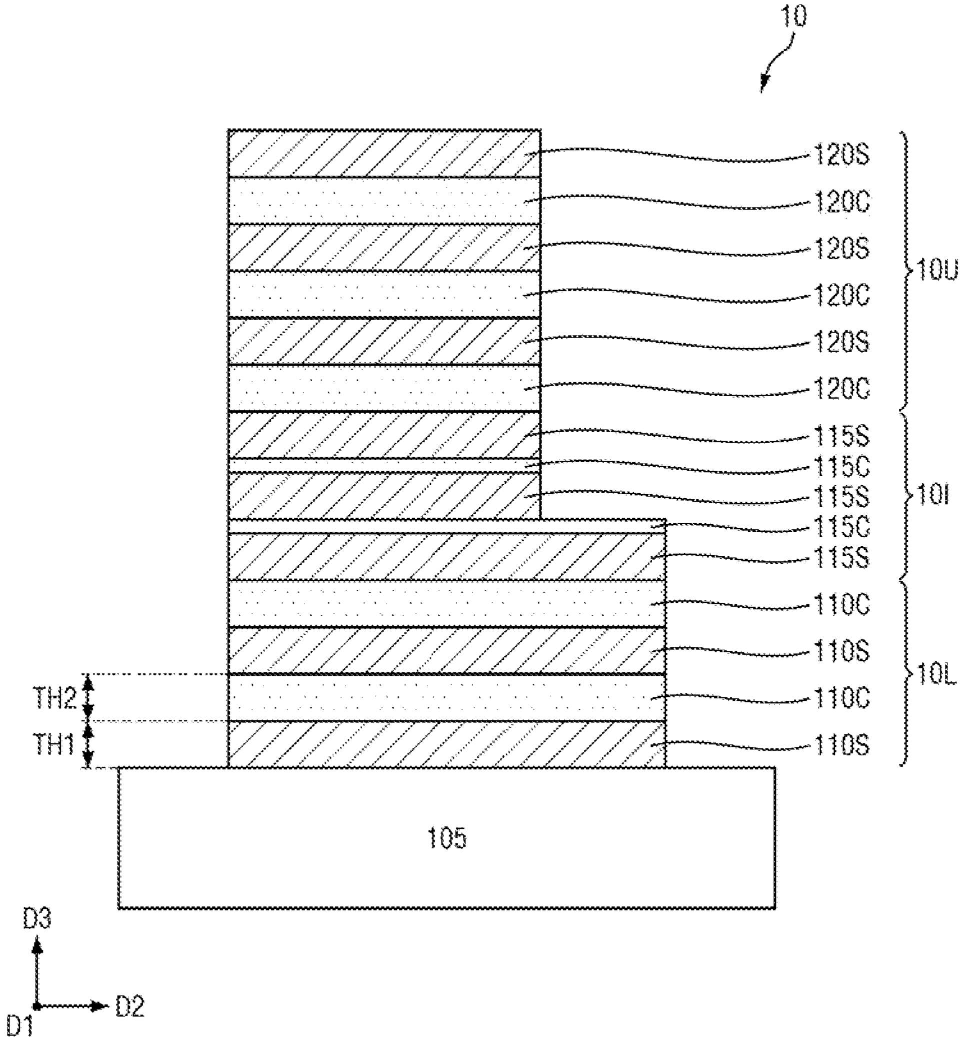

FIG. 1A illustrates a channel-length cross-section view of a nanosheet stack including a plurality of nanosheet layers formed on a substrate, according to an embodiment. FIG. 1B illustrates a channel-width cross-section view of the nanosheet stack of FIG. 1A taken along a line I-I' shown in FIG. 1A, according to an embodiment.

Referring to FIGS. 1A and 1B, a nanosheet stack 10 may include a lower channel structure 10L, an isolation structure 10I and an upper channel structure 10U in this order on a substrate 105, and each of these stacks includes a plurality of semiconductor nanosheet layers (hereafter “nanosheet layers”) that include a plurality of sacrificial layers, channel layers, sacrificial isolation layers and channel isolation layers as described below.

In the embodiments presented herein, the channel structures are referred to as such because these structures are to become a channel including channel layers connecting source/drain regions to each other for current flow between in a nanosheet transistor in a later step of manufacturing the multi-stack semiconductor device. Further, the sacrificial layers and the sacrificial isolation layers are referred to as such because, these layers, unlike the channel layers and the channel isolation layers, are to be removed in later steps of manufacturing the multi-stack semiconductor device in the present embodiments.

The lower channel structure 10L may include a plurality of lower sacrificial layers 110S and lower channel layers 110C alternatingly layered (or stacked) on the substrate 105. The isolation structure 10I isolating the lower channel structure 10L from the upper channel structure 10U between these two channel structures may include two or more sacrificial isolation layers 115S and one or more channel isolation layers (or isolation layers) 115C also alternatingly layered on the lower channel structure 10L. Further, the upper channel structure 10U may include a plurality of upper sacrificial layers 120S and upper channel layers 120C also alternatingly layered on the lower channel structure 10L.

According to an embodiment, the nanosheet stack 10 shown in FIGS. 1A and 1B may be formed by epitaxially growing nanosheet layers one layer and then next in the following order: a sacrificial layer, a channel layer, a sacrificial layer, a channel layer, a sacrificial isolation layer, a channel isolation layer, a sacrificial isolation layer, a channel isolation layer, a sacrificial isolation layer, a channel layer, a sacrificial layer, a channel layer, a sacrificial layer, a channel layer, and a sacrificial layer. However, the above example number of these layers does not limit embodiments of the disclosure.

As will be described later, the lower channel layers 110C are provided to form lower channels of a lower channel structure for current flow between source/drain regions of a lower nanosheet transistor to be formed from the lower channel structure 10L. Likewise, the upper channel layers 120C are provided to form upper channels of an upper channel structure for current flow between source/drain regions of an upper-stack nanosheet transistor to be formed from the upper channel structure 10U.

The channel layers 110C and 120C each may have a thickness TH1 ranging 8 nm to 13 nm, not being limited thereto, and the sacrificial layers 110S and 120S each may have a thickness TH2 ranging 8 nm to 13 nm, not being limited thereto. However, according to an embodiment, the channel layers 110C and 120C may have a same thickness. Further, according to an embodiment, the sacrificial layers 110S and 120S may also have a same thickness. A channel layer 110C or 120C and a sacrificial layer 110S or 120S may have a same thickness or different thicknesses, according to embodiments.

Figure 11A:
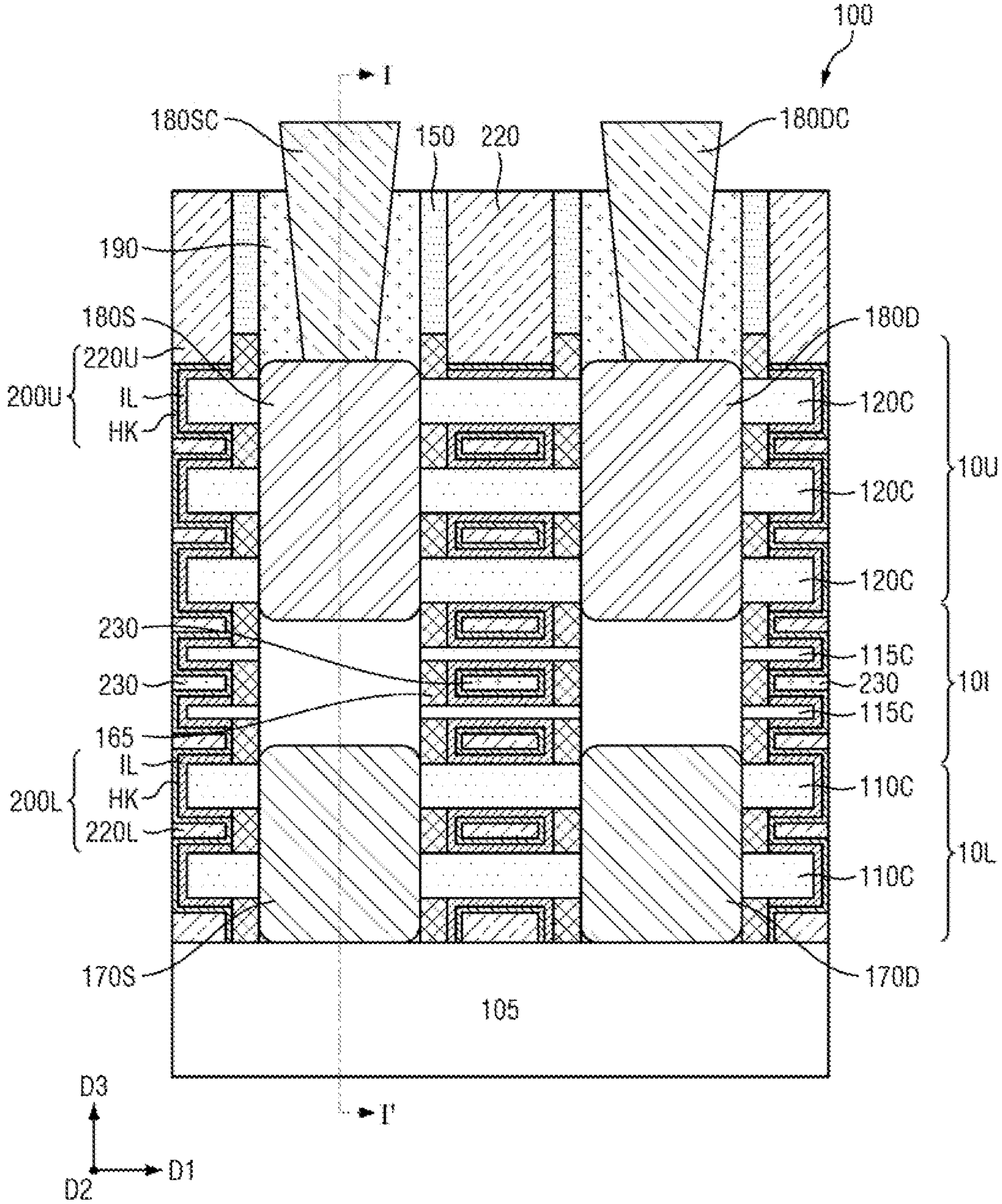
Figure 11B:
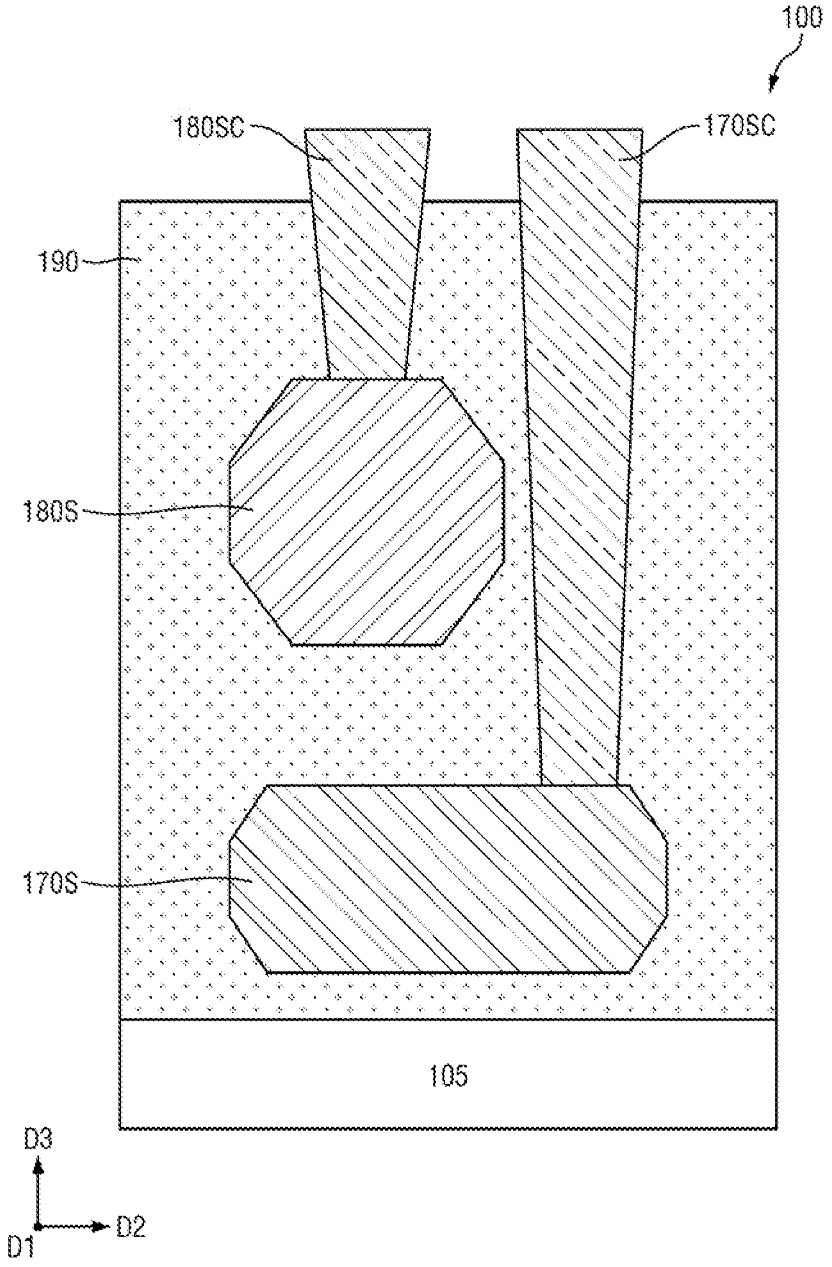

FIGS. 1A and 1B show that the number of the lower channel layers 110C is two (2) while the number of the upper channel layers 120C is three (3). That is, the number of the upper channel layers 120C is greater than that of the lower channel layers 110C. Instead, each of the lower channel layers 110C has a greater width, which will be a channel width of the lower nanosheet transistor, in a D2 direction than each of the upper channel layers 120C, while they have the same length in a D1 direction. That is, the lower channel structure 10L has a greater width than the upper channel structure 10U in the D2 direction. This structure of the nanosheet stack 10 is provided to allow a space for a source/drain region contact structure to be connected to an upper surface of a source/drain region of the lower nanosheet transistor without increasing a lateral footprint of the multi-stack semiconductor device to be formed in the present embodiment, as shown in FIGS. 11A and 11B. However, the above example numbers of channel layers and sacrificial layers do not limit embodiments of the disclosure.

As the width of the upper channel structure 10U is smaller than that of the lower channel structure 10L while their lengths are equal to each other, a greater number of channel layers are formed so that an effective channel width ($W_{eff}$) of the lower nanosheet transistor can be equal to that of the upper nanosheet transistor when they are completed at a later step of manufacturing the multi-stack semiconductor device. Thus, for the aforementioned purposes, a different number of channel layers may be formed in the lower and upper channel structures 10L, 10U, according to embodiments. In the meantime, in order to provide the same effective channel width across the lower and upper nanosheet transistors, the thickness of the channel layers 110C and 120C may also be controlled differently from those shown in FIGS. 1A and 1B.

Although not shown, the different channel-width nanosheet stack 10 shown in FIGS. 1A and 1B may be formed by applying photolithography and anisotropic etching operations on a same channel-width nanosheet stack.

In the nanosheet stack 10 shown in FIGS. 1A and 1B, the lower and upper sacrificial layers 110S and 120S are provided as a dummy structure used to form the lower and upper channel layers 110C and 120C, and will be replaced by portions of lower and upper replacement metal gate (RMG) structure at a later step.

The substrate 105 may be a silicon (Si) substrate although it may include other materials such as silicon germanium (SiGe), silicon carbide (SiC), not being limited thereto. Each of the sacrificial layers 110S and 120S may include silicon-germanium (SiGe), and each of the channel layers 110C and 120C may include silicon (Si). A Ge concentration of each of the sacrificial SiGe layers may be set to 25% to 50%, not being limited thereto. However, each of the sacrificial layers 110S and 120S may not be limited to a single SiGe layer, and instead, may include one or more same- or different-material layers, according to embodiments. Likewise, each of the channel layers 110C and 120C may not be limited to a single Si layer, and instead, may include one or more same- or different-material layers. According to an embodiment, another SiGe layer having a Ge concentration different from that of the sacrificial SiGe layers 110S, 120S and 115S may be included in the channel layers 110C and 120C as long as this channel SiGe layer can endure an etching operation using etch selectivity with respect to Ge for formation of inner spacers in a later step.

According to an embodiment, each of the sacrificial isolation layers 115S may include the same material(s) included in the sacrificial layers 110S and 120S of the channel structures 10L and 10U. For example, the sacrificial isolation layers 115S may be formed of SiGe with 25% to 50% Ge concentration, not being limited thereto. Like the sacrificial layers 110S and 120S, the sacrificial isolation layers 115S of the isolation structure 10I may also be formed of a material(s) equivalent to of different from that of the sacrificial layers 110S and 120S for the purpose of isolating the channel structures 10L an 10U from each other, according to embodiments.

According to an embodiment, the sacrificial isolation layers 115S each may have a thickness similar to or equal to the thickness TH2 of each of the sacrificial layers 110S and 120S in a range of 8 nm to 13 nm, not being limited thereto, in addition to having the same material forming the sacrificial layers 110S and 120S.

According to an embodiment, each of the channel isolation layers 115C may include the same material included in the channel layers 110C and 120C of the channel structures 10L and 10U. For example, the channel layers 115C may be formed of Si. Like the channel layers 110C and 120C, the channel isolation layers 115C may also be formed of a material(s) equivalent to or different from that the channel layers 110C and 120C, according to embodiments. For example, the channel isolation layers 115C may be formed of a material different from the material, e.g., Si, forming the channel layers 110C and 120C, and having an etch selectivity different from the sacrificial layers 110S, 120S and/or the sacrificial isolation layers 115S so that the channel isolation layers 115C may not be removed by selective etching the sacrificial layers 110S, 120S and the sacrificial isolation layers 115S in a later step. Here, the etch selectivity or etch rate of the different material forming the channel isolation layers 115C may be the same as or similar to that of the channel layers 110C and 120C, according to an embodiment.

According to an embodiment, a thickness TH3 of each of the channel isolation layers 115C including Si may be 2 nm or less, not being limited thereto. These channel isolation layers 115C may be provided to address the problem of the SiGe layer with a lower Ge-concentration in a plurality of SiGe layers having different Ge concentrations as discussed earlier in the Background section. Since each of the channel isolation layers 115C may be formed of a material(s) which is the same as that of the channel layers 110C and 120C, e.g., Si, the channel isolation layers 115C may sufficiently endure an etching operation based on etch selectivity with respect to the sacrificial layers 110S, 120S and the sacrificial isolation layers 115S, e.g., Ge included therein, for inner spacer formation in a later step. Thus, unlike the isolation structure formed of a plurality of SiGe layers having different Ge concentrations, the sacrificial isolation layers 115S may not lose a proper structural profile for the inner spacer formation.

Accordingly, the channel isolation layers 115C of the present embodiment may independently or together with the characteristics (material and thickness) of the sacrificial isolation layers 115S described above may be able to provide an improved isolation structure profile for the inner spacer formation.

Further, as the isolation structure 10I may include the same materials included in the channel layers 110C, 120C and the sacrificial layers 110S, 120S as in the present embodiment, epitaxially growing the nanosheet stack 10 may be easier and simpler than growing an isolation structure including different materials.

In FIGS. 1A and 1B, the isolation structure 10I is formed of only three (3) sacrificial isolation layers 115S and two (2) channel isolation layers 115C. However, these numbers of the isolation layers are not limited thereto, according to embodiments. For example, more or less than three sacrificial isolation layers 115S and more or less than two channel isolation layers may be alternatingly formed as the isolation structure 10I.

Figure 2A:
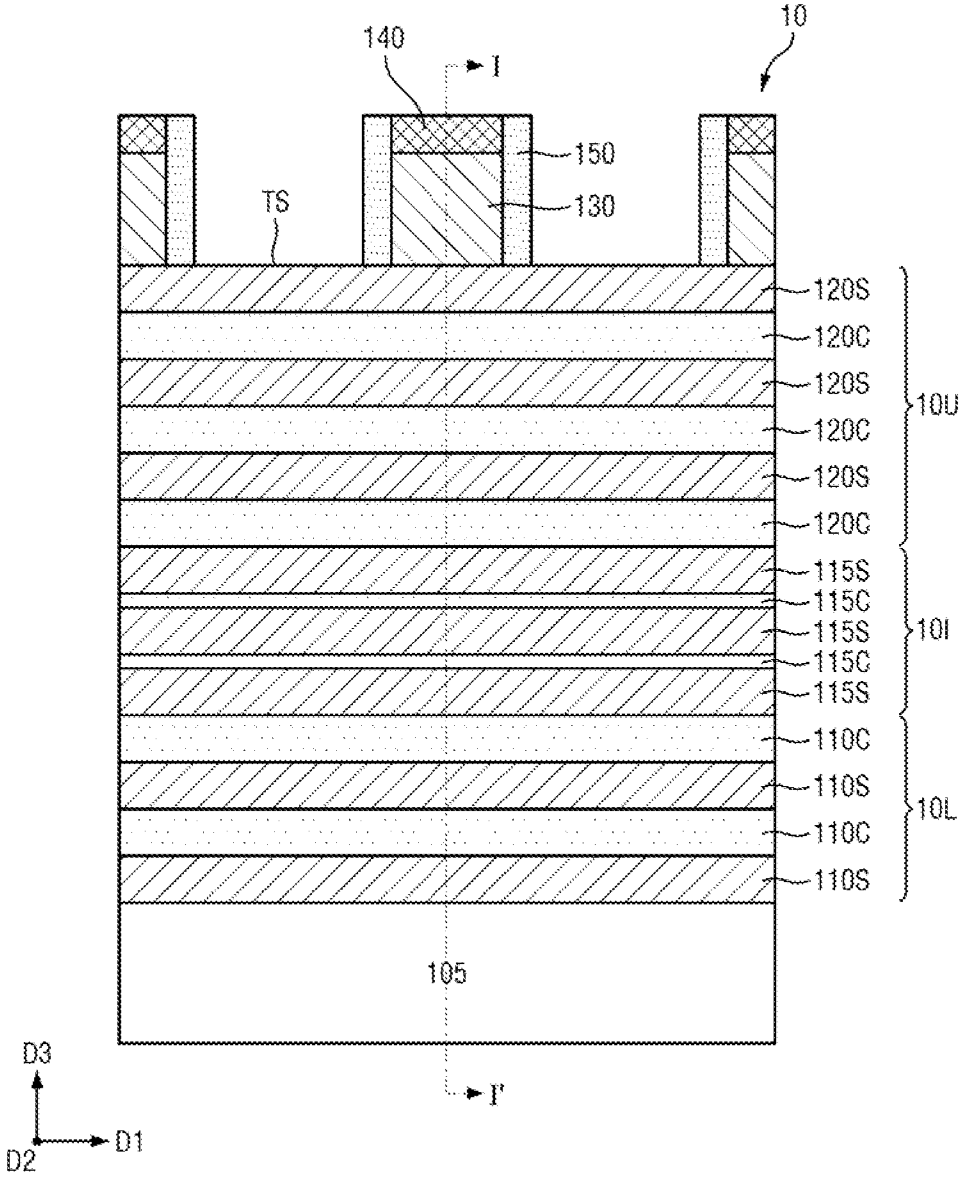
Figure 2B:
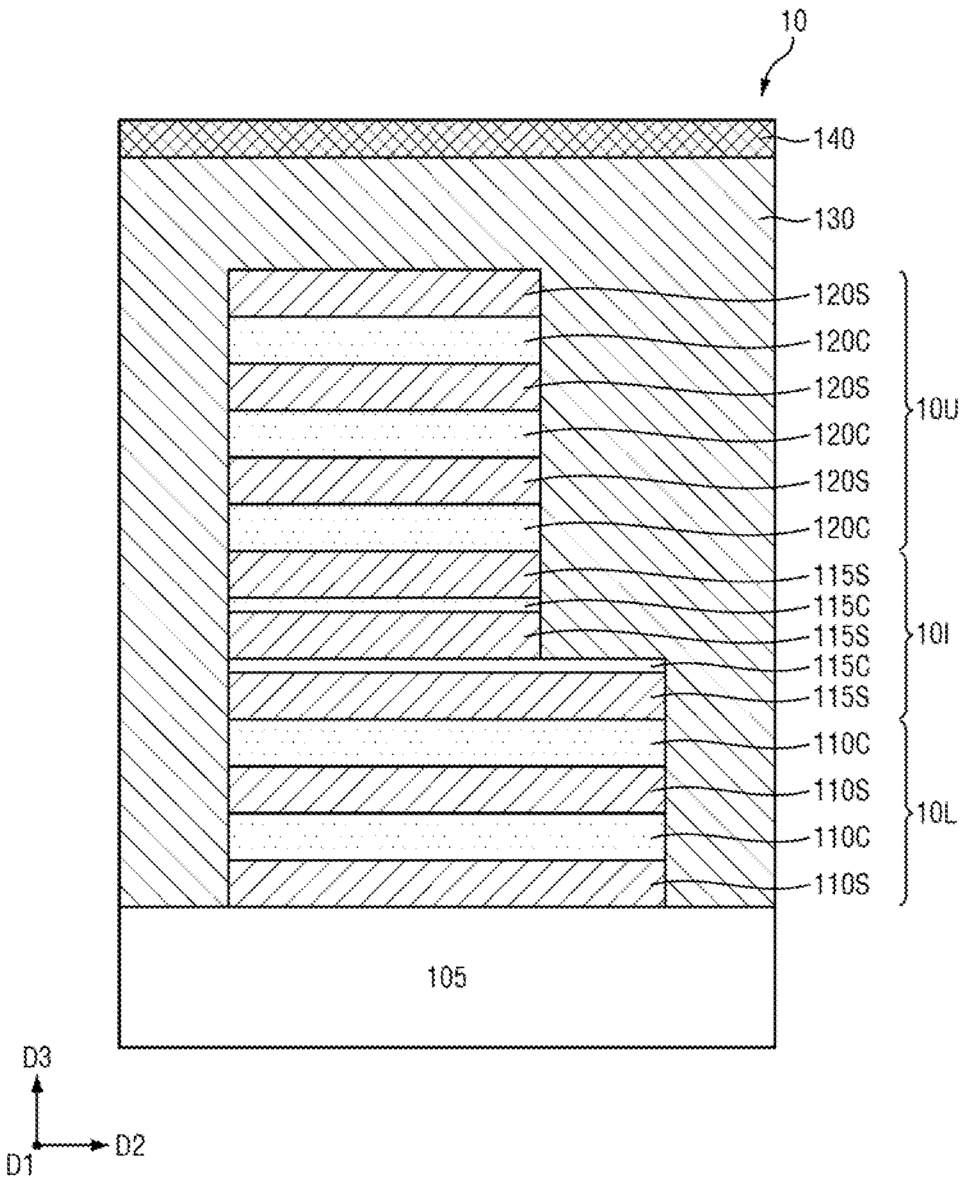

FIG. 2A illustrates a channel-length cross-section view a nanosheet stack and a plurality of dummy gate structures formed thereon, according to an embodiment. FIG. 2B illustrates a channel-width cross-section view of the nanosheet stack of FIG. 2A taken along a line I-I' shown in FIG. 2A, according to an embodiment.

Referring to FIGS. 2A and 2B, a dummy gate structure 130 is formed to surround the nanosheet stack 10 of FIGS. 1A and 1B across the D2 direction, which is the channel width direction. In addition, a hard mask 140 is formed on a top surface of the dummy gate structure 130, and a gate spacer 150 is formed on side surfaces of the dummy gate structure 130.

FIGS. 2A and 2B also show that two additional dummy gate structures are formed at sides of the dummy gate structure 130 on the nanosheet stack 10. These two dummy gate structures are shown there only in the form of partial structure to indicate that a desired number of dummy gate structures can be formed to surround the nanosheet stack 10 in the D2 direction, and corresponding channel structures can be formed therebelow.

The dummy gate structure 130, the hard mask 140, and the gate spacer 150 will be used as a mask structure to divide the nanosheet stack 10 into a plurality of nanosheet stacks, and form inner spacers of the lower and upper nanosheet transistors of the multi-stack semiconductor device in subsequent steps.

The hard mask pattern 140 is used to obtain the dummy gate structure 130 as shown in FIGS. 2A and 2B from a dummy gate material (not shown) deposited on an entire top surface of the nanosheet stack 10 of FIGS. 1A and 1B. The dummy gate structure 130 may include amorphous silicon or amorphous carbon, not being limited thereto, and the hard mask pattern 140 may include silicon nitride (SiN), silicon dioxide ($SiO_2$) or silicon carbide (SiC), not being limited thereto. Based on the hard mask pattern 140, the dummy gate structure 130 may be formed through, for example, a combination of photolithography and anisotropic etching, not being limited thereto. The gate spacer 150 may include a material such as SiN, silicon carobonitride (SiCN) or silicon oxycarbonitride (SiOCN), not being limited thereto, and may be formed on the side surfaces of the dummy gate structure 130 through, for example, a sidewall image transfer (SIT) process and dry etching such as reactive ion etching (RIE), not being limited thereto.

Figure 3:
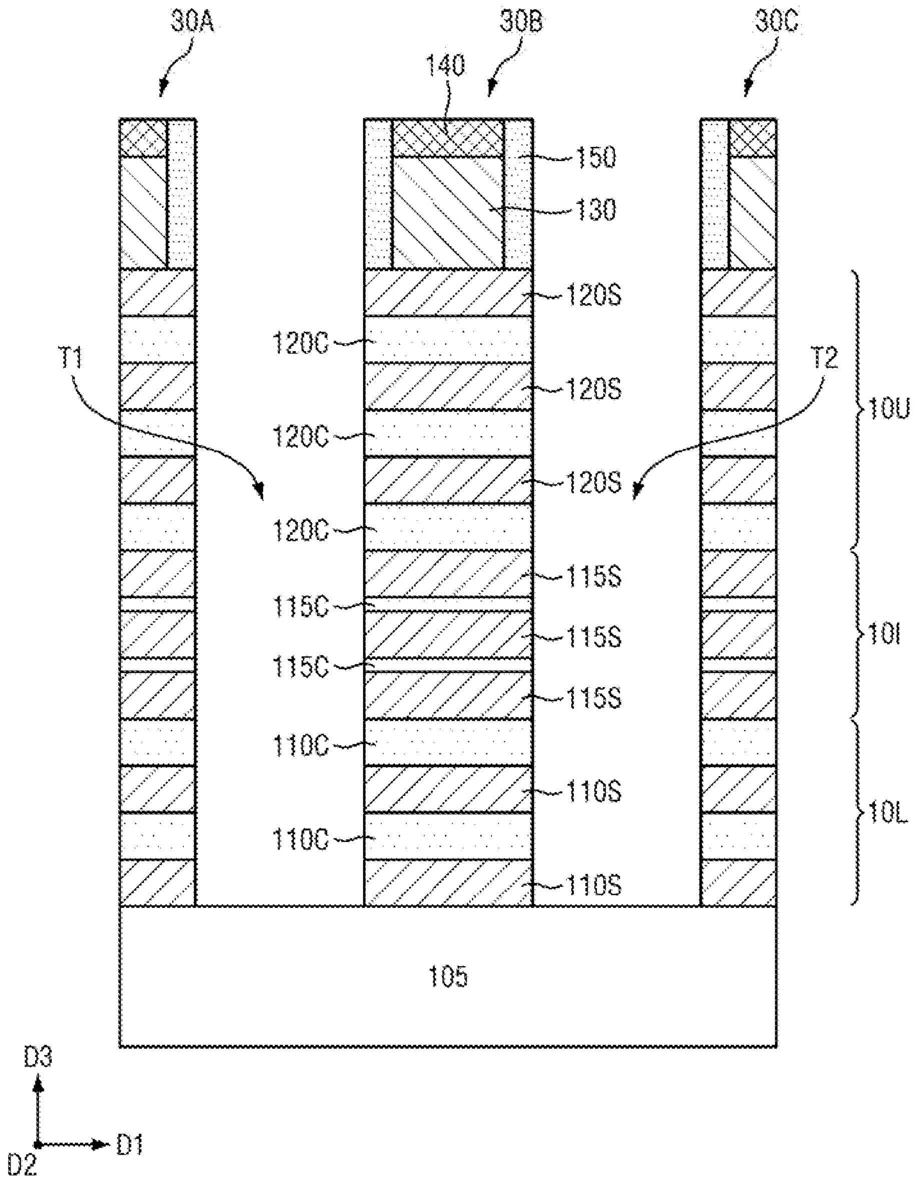

FIG. 3 illustrates a channel-length cross-section view of a nanosheet stack which is divided into a plurality of nanosheet stacks based on dummy gate structures with gate spacers and a hard mask pattern on side and top surfaces thereof, according to an embodiment.

Referring to FIG. 3, the nanosheet stack 10 of FIGS. 2A and 2B is divided into a plurality of nanosheet stacks 30A to 30C on the substrate 105. These nanosheet stacks may be obtained by etching the nanosheet stack 10 from top surfaces TS thereof exposed between the dummy gate structures 130 with respective hard mask patterns 140 and gate spacers 150 on the side and top surfaces thereof. For example, reactive ion etching (RIE) may be performed from the exposed top surfaces TS of the nanosheet stack 10 down to the substrate 105 using the dummy gate structures 130 with respective hard mask patterns 140 and gate spacers 150 thereon as a mask structure for the etching operation.

By this etching operation, two trenches T1 and T2 exposing a top surface of the substrate 105 upward may be obtained. Although not shown, when an isolation layer is formed on the top surface of the substrate 105 when the nanosheet stack 10 of FIGS. 1A and 1B is formed, a top surface of the isolation layer instead of the top surface of the substrate 105 may be exposed through the trenches T1 and T2.

In the trenches T1 and T2, each of the nanosheet stacks 30A to 30C may expose side surfaces of corresponding lower and upper channel structures and an isolation structure therebetween obtained from the lower and upper channel structures 10L, 10U and the isolation structure 10I therebetween as included in the nanosheet stack 10 of FIGS. 2A and 2B. In other words, the trenches T1 and T2 may expose side surfaces of lower channel layers 110C and lower sacrificial layers 110S in each lower channel structure 10L, side surfaces of sacrificial isolation layers 115S and channel isolation layers 115C in each isolation structure 10I, and side surfaces of upper channel layers 120C and upper sacrificial layers 120S in each upper channel structure 10U.

Figure 4:
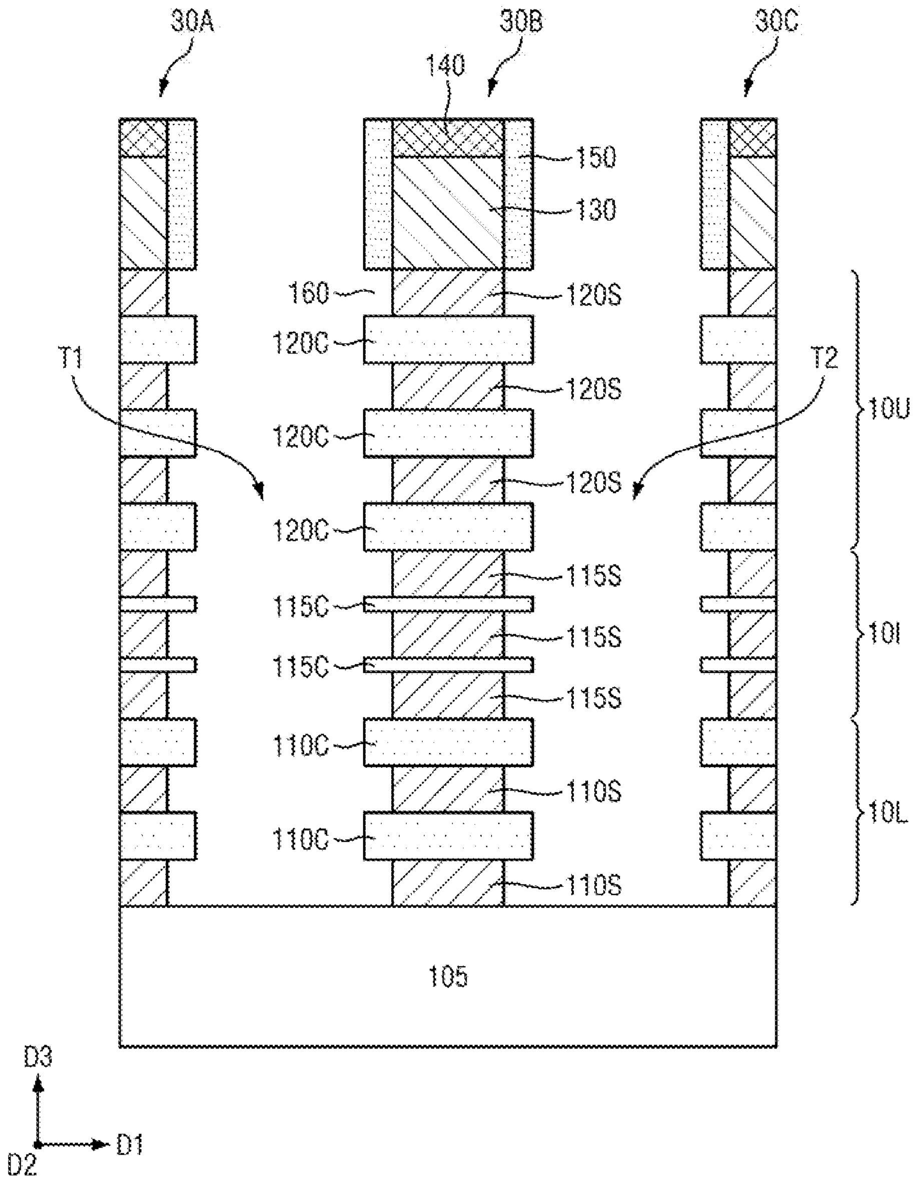

FIG. 4 illustrates a channel-length cross-section view of a plurality of nanosheet stacks, from each of which side portions of sacrificial layers and sacrificial isolation layers below gate spacers are removed for inner spacer formation, according to an embodiment.

Referring to FIG. 4, a selective etching operation is performed on side surfaces of the nanosheet stacks 30A to 30C. This etching operation may selectively pull back or etch away portions of the sacrificial layers 110S, 120S and the sacrificial isolation layers 115S underlying below the gate spacer 150 of each of the nanosheet stacks 30A to 30C. For example, isotropic etching may be applied using, for example, a hydrogen chloride gas which etches an SiGe or Ge component in the sacrificial layers 110S, 120S and the sacrificial isolation layers 115S without attacking an Si component in the channel layers 110C, 120C and the channel isolation layers 115C. As another example, wet chemical etching and/or dry plasma etching may be used for this selective etching operation.

As the selective etching operation may attack only the SiGe or Ge component, at least a portion of each of the sacrificial layers 110S, 120S and the sacrificial isolation layers 115S underlying below the gate spacer 150 may be removed, and thus, respective cavities (or grooves) 160 may be formed at sides of the sacrificial layers 110S, 120S and the sacrificial isolation layers 115S in the trenches T1 and T2, as shown in FIG. 4. As described in a subsequent step, these cavities are provided for inner spacer formation.

Due to the selective etching operation in this step to form the cavities 160, a length of each of the sacrificial layers 110S, 120S and the sacrificial isolation layers 115S may be reduced by a width of the gate spacer 140 in the D1 direction, that is, channel-length direction.

Figure 5A:
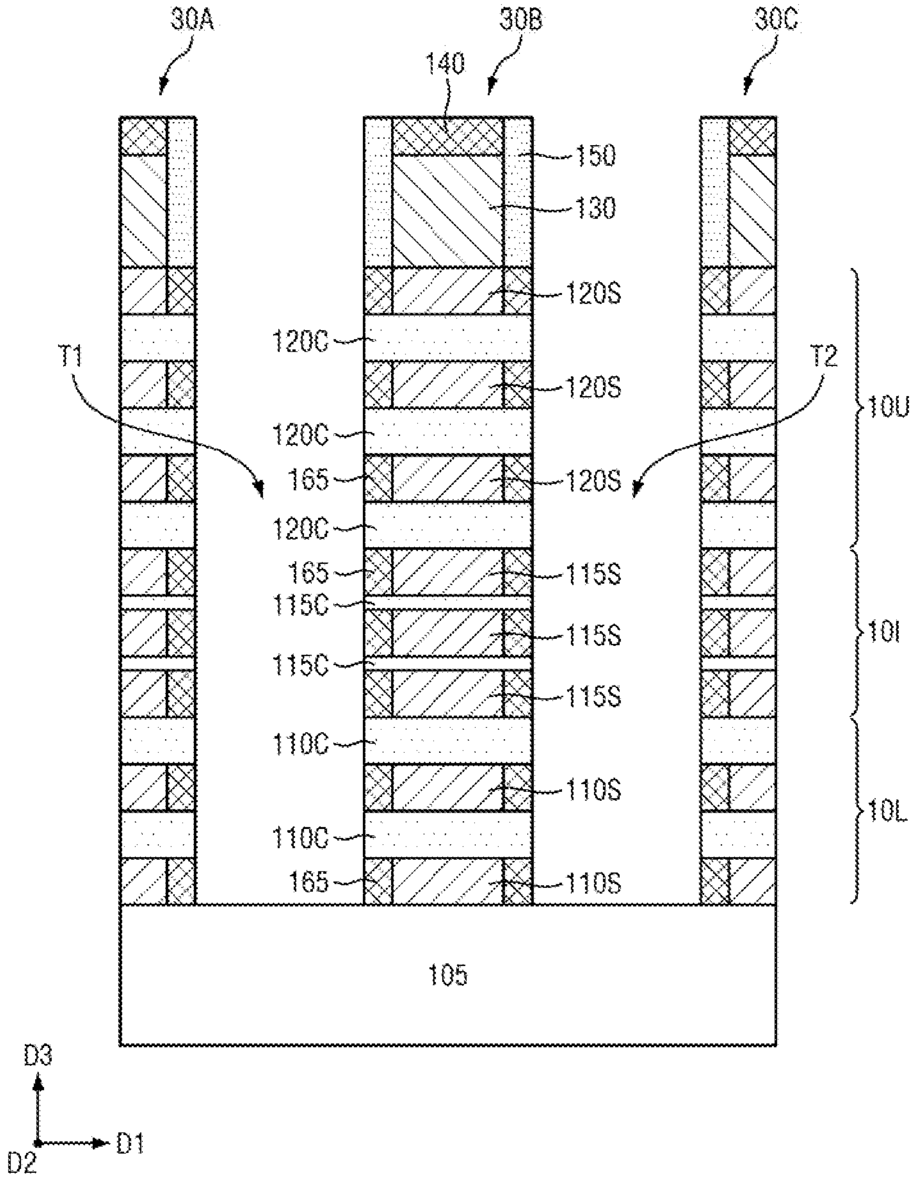
Figure 5B:
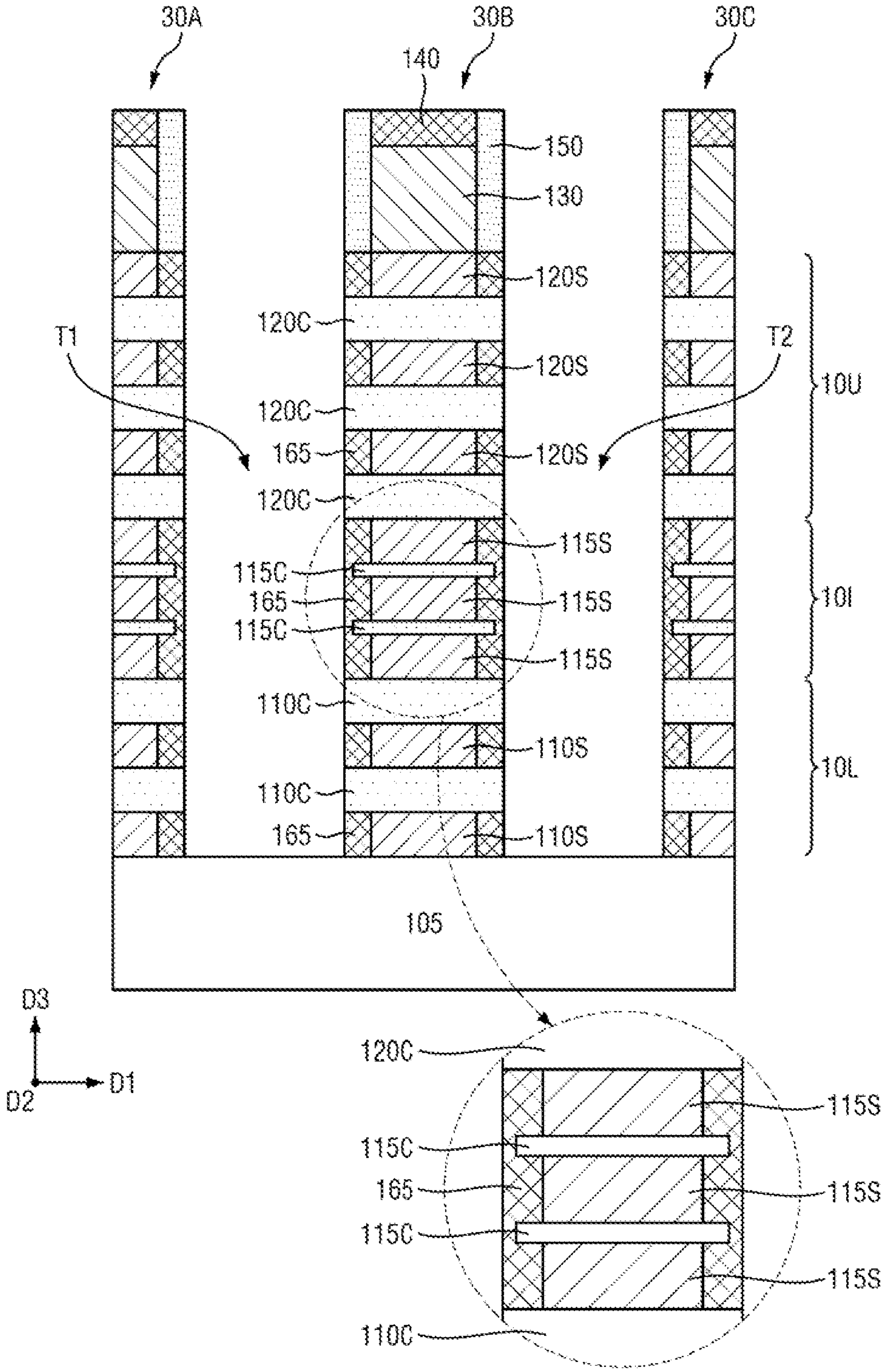

FIGS. 5A and 5B illustrate channel-length cross-section views of a plurality of nanosheet stacks, in each of which inner spacers are formed, according to an embodiment.

Referring to FIGS. 5A and 5B, the cavities 160 formed in the nanosheet stacks 30A to 30C of FIG. 4 may be filled in with an inner spacer material to form inner spacers 165 therein. The inner spacer material may include one or more materials including SiN, silicon oxide (SiO), silicon oxynitride (SiON), silicon oxycarbide (SiOC), silicon boron carbonitride (SiBCN), silicon oxy carbonitride (SiOCN), and/or silicon carbide (SiC), not being limited thereto. The inner spacer material(s) may be conformally deposited on the cavities 160 to form the inner spacers 165 by, for example, atomic layer deposition (ALD), plasma enhanced atomic layer deposition (PEALD), chemical vapor deposition (CVD), plasma enhanced chemical vapor deposition (PECVD), or combinations thereof, followed by isotropic wet chemical etching or dry etching, not being limited thereto, to remove the inner spacer material(s) not vertically below the gate spacer 150, the channel layers 110C, 120C and the channel isolation sacrificial layers 115C.

Each of the inner spacers 165 may have a thickness substantially equal to that of a corresponding sacrificial layer 110S, 120S or sacrificial isolation layer 115S.

Due to this deposition and the subsequent etching operation, side surfaces of the inner spacers 165, the channel layers 110C, 120C and the channel isolation layers 115C exposed in the trenches T1 and T2 may all vertically coplanar, as shown in FIG. 5A, according to an embodiment.

However, as shown in FIG. 5B, the inner spacer material may remain on the side surfaces of the channel isolation layers 115C in the trenches T1 and T2 after the etching operation is applied subsequent to the conformal deposition as above, according to an embodiment. This is because at least some side portions of the channel isolation layers 115C in the trenches T1 and T2 may have been removed during the selective etching of the sacrificial layers 110S, 120S and the sacrificial isolation layers 115S in the previous step. Since the channel isolation layers 115C are very thin layers compared to the channel layers 110C and 120C, they may have been affected by the selective etching. Further, the characteristics of the conformal deposition, for example, by atomic layer deposition (ALD) using a thin film deposition technique, of the inner spacer material and the small thickness of the channel isolation layers 115C even after the selective etching may cause the inner spacer material may remain on the side surfaces of the channel isolation layers 115C.

Thus, in the nanosheet stack structures 30A to 30C shown in FIG. 5B, middle inner spacers formed at side surfaces of the isolation structure 10I among the inner spacers 165 may be vertically connected to each other. However, lower inner spacers formed at the lower channel structure 10L may not be connected to each other, and also, upper inner spacers formed as the upper channel structure 10U may not be connected to each other.

Here, it is understood that the steps of manufacturing the multi-stack semiconductor device herebelow are based on the structure of the nanosheet stack shown in FIG. 5A between FIGS. 5A and 5B. However, it is also understood that these steps may also apply to the alternative structure of the nanosheet stacks 30A to 30C shown in FIG. 5B.

Figure 6:
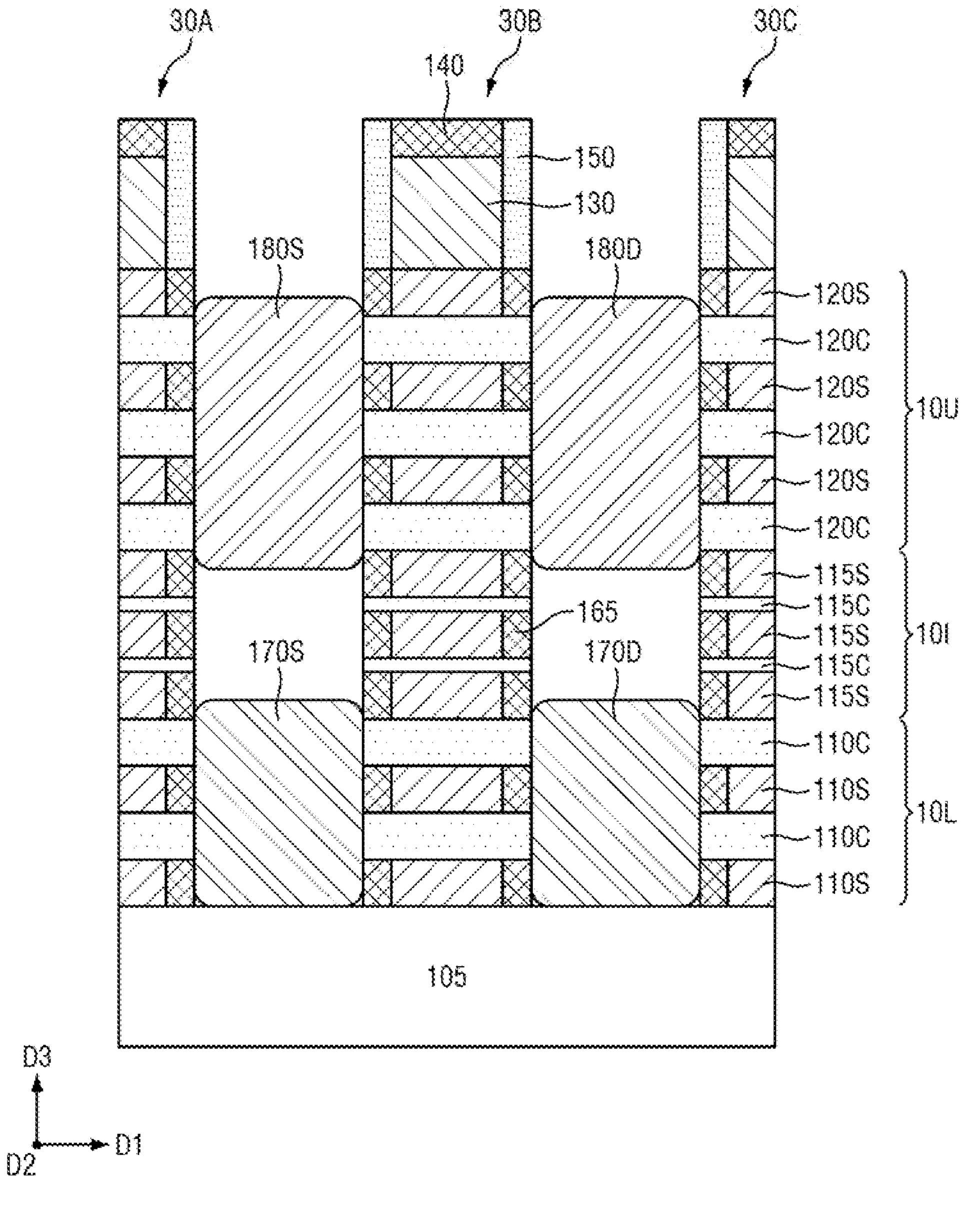

FIG. 6 illustrate a channel-length cross-section view of a plurality of nanosheet stacks where source/drain regions are formed at both ends of lower and upper channel structures, according to an embodiment.

As shown in FIG. 6, lower source/drain regions 170S, 170D and upper source/drain regions 180A, 180D are formed at both ends of the lower channel structure 10L and both ends of the upper channel structure 10U of the nanosheet stacks 30A to 30C of FIGS. 5A and 5B. Here, the both ends of the channel structures 10L and 10U refer to two opposite ends of each channel structure in the channel-length direction, that is, the D1 direction.

For example, the lower source/drain region 170S may be epitaxially grown from the lower channel layers 110C of the nanosheet stacks 30A and 30B and the substrate 105 of FIG. 5A, and the lower source/drain region 170D may be epitaxially grown from the lower channel layers 110C of the nanosheet stacks 30B and 30C and the substrate 105 of FIG. 5A. In a similar manner, the upper source/drain region 180S may be epitaxially grown from the upper channel layers 120C of the nanosheet stacks 30A and 30B of FIG. 5A, and the upper source/drain region 180D may be epitaxially grown from the upper channel layers 120C of the nanosheet stacks 30B and 30C of FIG. 5A. Thus, the lower source/drain regions 170S, 170D and the upper source/drain regions 180S, 180D may include a material(s) similar to that included in the channel layers 110C and 120C. For example, the material(s) of these source/drain regions may be Si or SiGe, not being limited thereto.

Further, the lower source/drain regions 170S, 170D and the upper source/drain regions 180S, 180D may be doped with p-type or n-type dopants. For example, the lower source/drain regions 170S, 170D may be doped with or implanted by n-type dopants such as arsenic or phosphorous, not being limited thereto, and the upper source/drain regions 180S, 180D may be doped with or implanted by p-type dopants such as boron, not being limited thereto. As another example, both of the lower and upper source/drain regions 170S, 170D, 180S and 180D may be doped with the same p-type or n-type dopants.

Although not shown in the drawings, when the lower source/drain regions 170S and 170D are epitaxially grown from the lower channel layers 110C, a minimal epitaxial layer, if any, may also grow from the thin channel isolation layers 115C. This minimal epitaxial layer may be removed before the upper source/drain regions 180S and 180D are formed from the upper channel layers 120C. Further, in the space where the minimal epitaxial layer is removed, a protection layer such as spin-on-glass (SOG) including silicon oxide ($SiO_2$) may be formed to prevent further epitaxial growth from channel isolation layers 115C during the formation of the upper source/drain regions 180S and 180D. This protection layer may be replaced by an interlayer dielectric (ILD) structure in a next step after the upper source/drain regions 180S and 180D is formed. However, in the case the inner spacer material for the inner spacer 165 remains on side surfaces of the channel isolation layers 115C as shown in FIG. 5B, the above epitaxial growth from the channel isolation layers 115C may be prevented.

As the source/drain regions 170S, 170D, 180S and 180D are formed from the channel layers 110C and 120C, these source/drain regions are connected to the channel layers 110C and 120C, respectively. However, these source/drain regions are isolated from the sacrificial layers 110S and 120S by the inner spacers 165.

Figure 7:
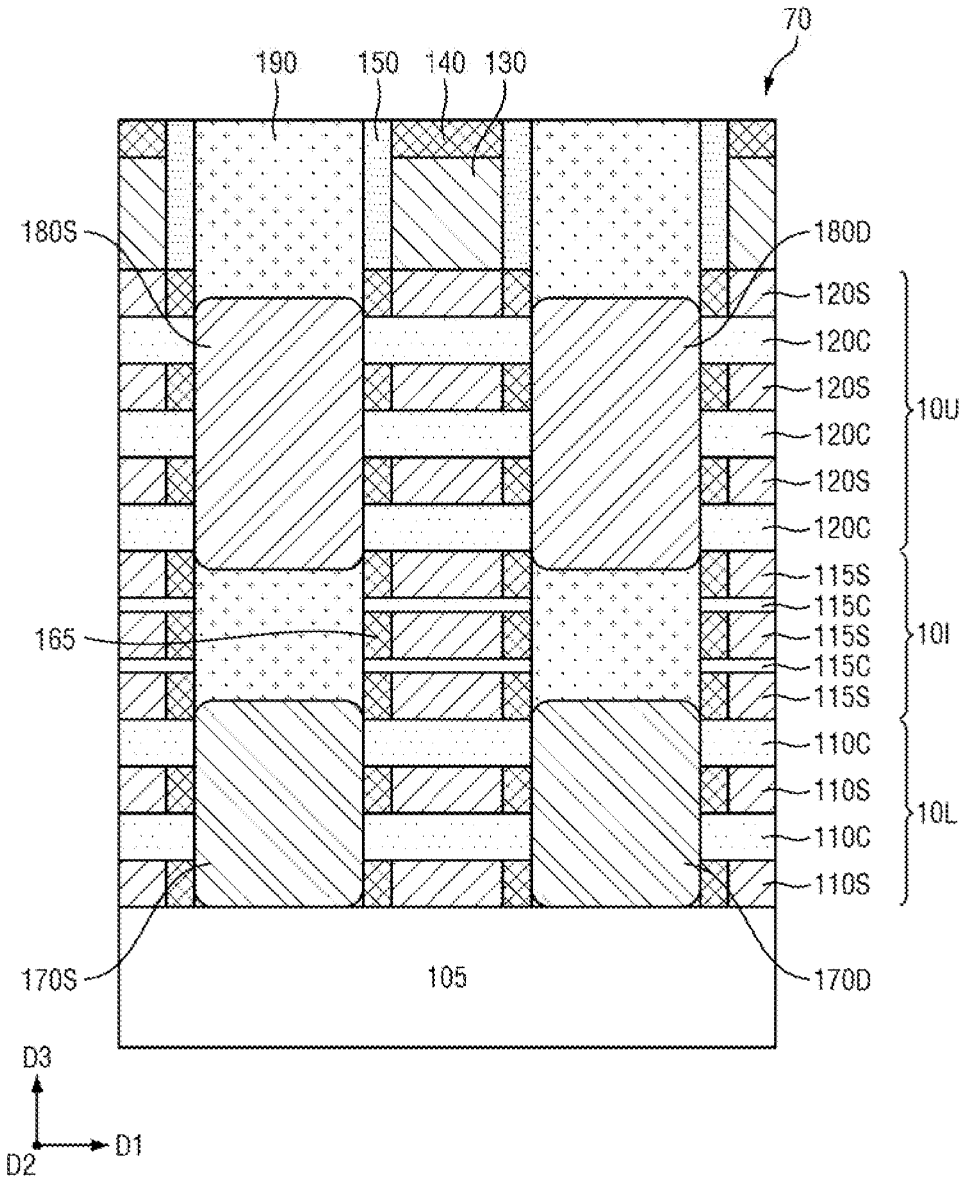

FIG. 7 illustrates a channel-length cross-section view of a multi-stack semiconductor device formed of a plurality of nanosheet stacks in which source/drain regions and an interlayer dielectric (ILD) structure are formed.

An ILD material may be deposited on the nanosheet stacks 30A to 30C, where the source/drain regions 170S, 170D, 180S and 180D are formed, at least to isolate these source/drain regions from each other or from other circuit elements. The deposited ILD material may be planarized so that top surfaces thereof may be coplanar with top surfaces of the hard mask pattern 140 and the gate spacer 150, thereby forming a multi-stack semiconductor device 70 with an ILD structure 190 as shown in FIG. 7.

The ILD material to form the ILD structure 190 may include silicon oxide (SiO, $SiO_2$, etc.), not being limited thereto.

Figure 8:
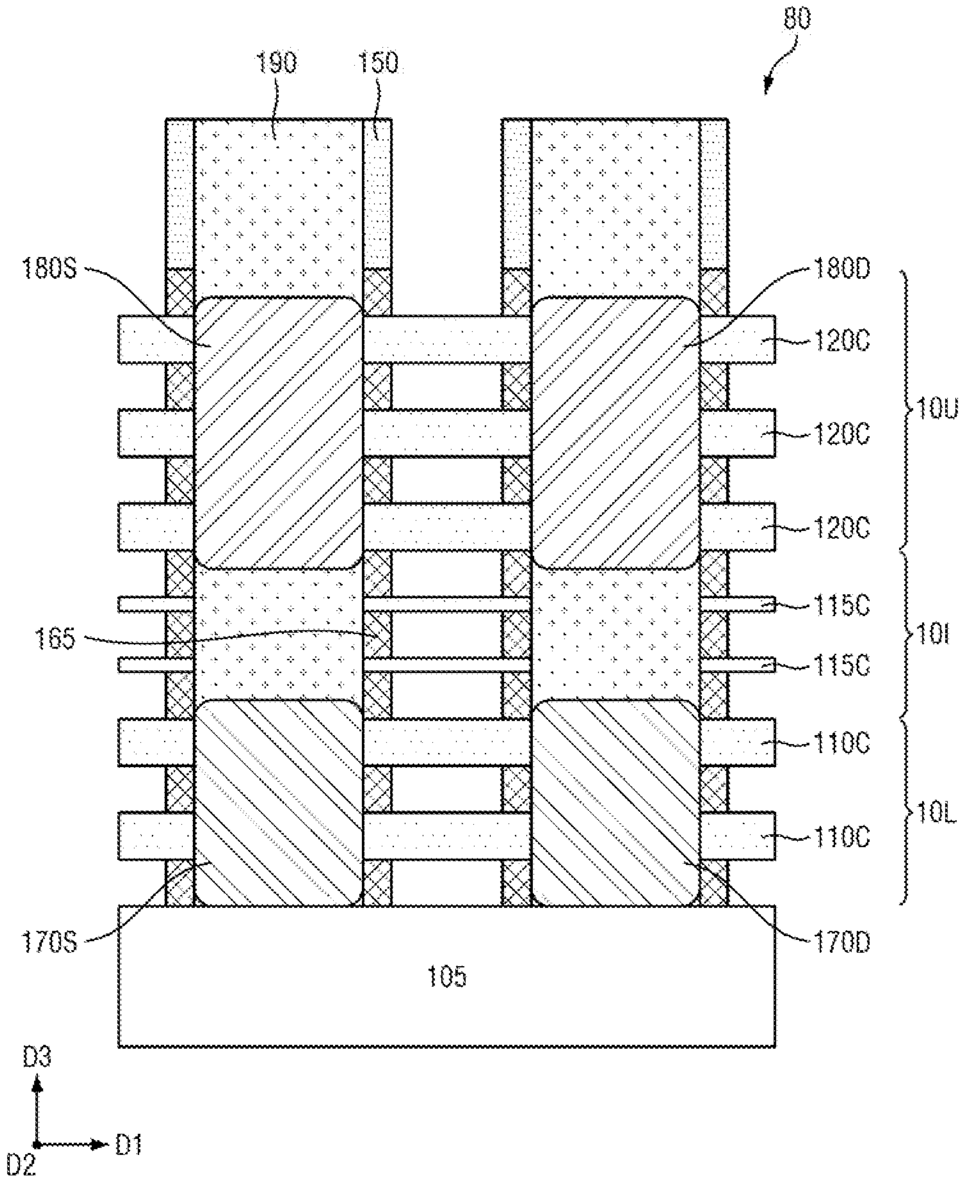

FIG. 8 illustrates a channel-length cross-section view of a multi-stack semiconductor device in which a dummy gate structure with a hard mask pattern thereon, sacrificial layers and sacrificial isolation layers having a same material as the sacrificial layers are removed to release channel layers and channel isolation layers having a same material as the channel layers in the multi-stack semiconductor device, according to an embodiment.

Referring to FIG. 8, the hard mask pattern 140 is stripped away from the multi-stack semiconductor device 70 of FIG. 7, and the dummy gate structure 130 is removed along with the sacrificial layers 110S, 120S and the sacrificial isolation layers 115S, according to an embodiment. The removal operation in this step may include isotropic and/or anisotropic reactive ion etching (RIE), wet etching and/or a chemical oxide removal (COR) process, not being limited thereto. Thus, in a multi-stack semiconductor device 80 shown in FIG. 8, the channel layers 110C, 120C as well as the channel isolation layers 115C may be released from the sacrificial layers 110S, 120S and the sacrificial isolation layers 115S that respectively surrounded the channel layers 110C, 120C and the channel isolation layers 115C in the multi-stack semiconductor device 70 of FIG. 7. By this channel release operation, the channel layers 110C, 120C and the channel isolation layers 115C may be exposed through an open space where a gate structure is to be formed in a subsequent step.

Since the sacrificial layers 110S, 120S and the sacrificial isolation layers 115S are formed of the same material(s), the removal process thereof may be simplified by using, for example, a same chemical etchant, according to an embodiment.

Figure 9A:
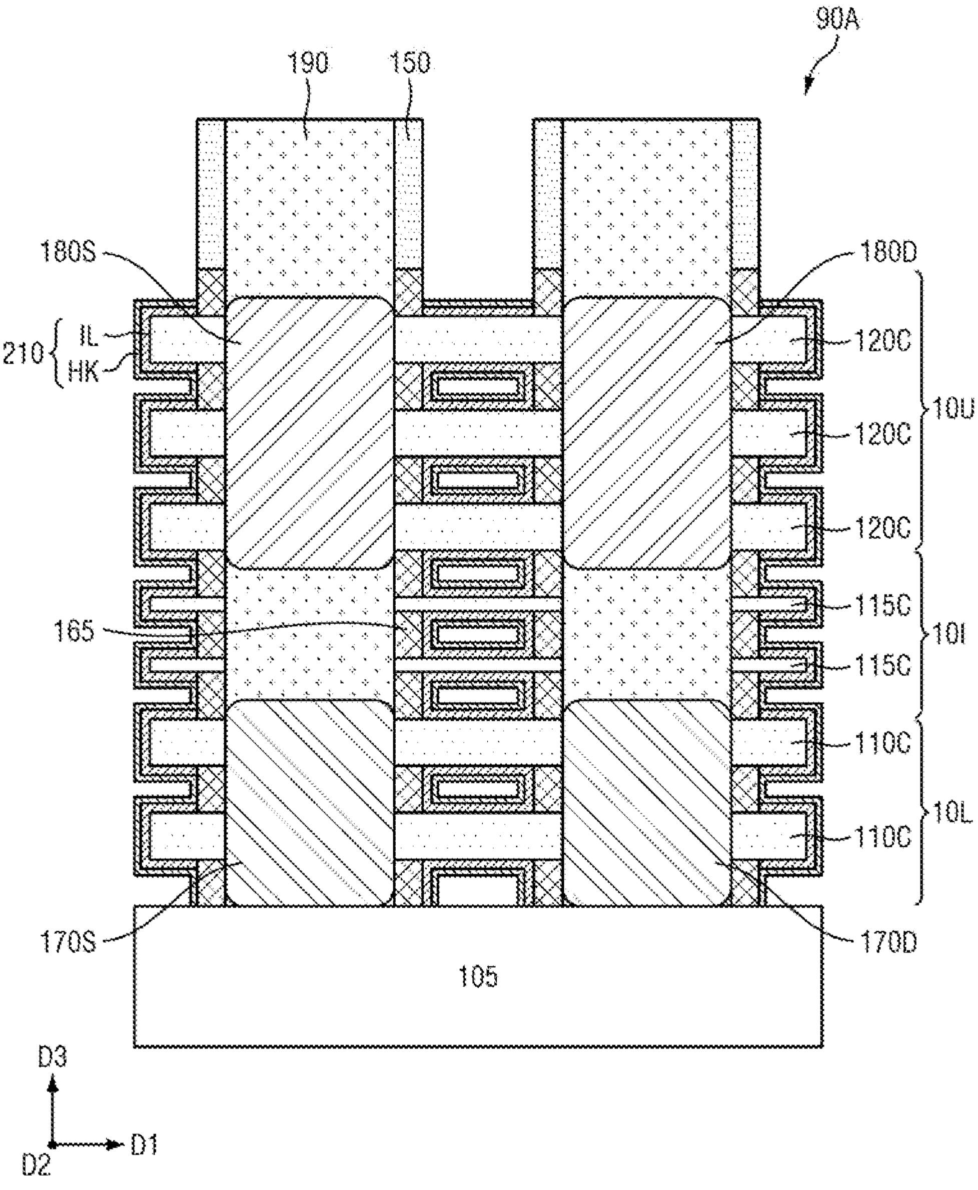
Figure 9B:
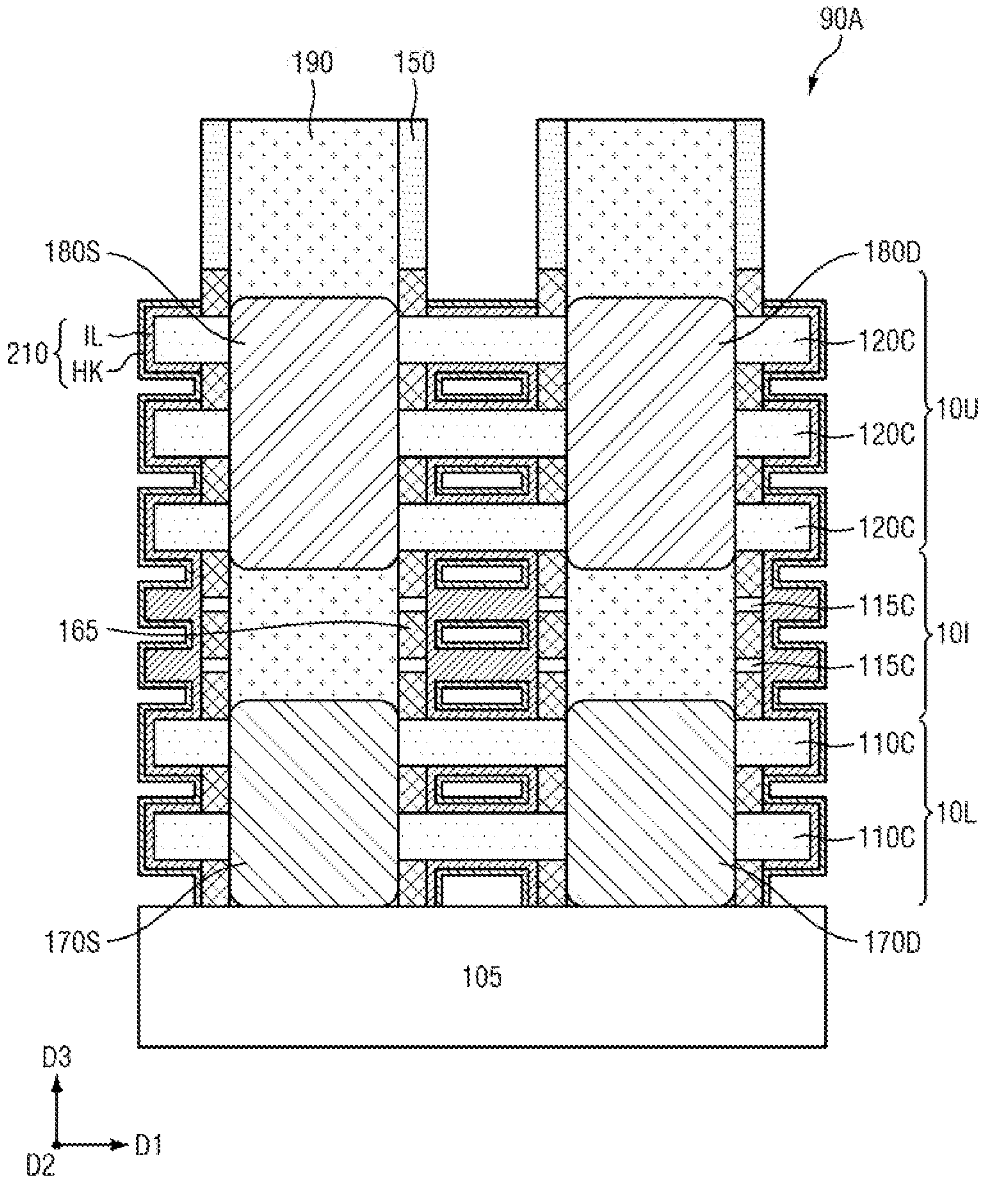

FIG. 9A illustrates a channel-length cross-section view of a multi-stack semiconductor device in which a gate dielectric layer is formed on channel layers and channel isolation layers to surround the channel layers and the channel isolation layers, according to an embodiment. FIG. 9B illustrates a channel-length cross-section view of a multi-stack semiconductor device in which a gate dielectric layer is formed on channel layers and channel isolation layers to surround the channel layers and remove the channel isolation layers by oxidization, according to an embodiment.

Referring to FIGS. 9A and 9B, each of a multi-stack semiconductor devices 90A and 90B is obtained in which a gate dielectric layer 210 including an interfacial layer IL and a high-k layer HK is formed on outer surfaces of the channel layers 110C, 120C and the channel isolation layers 115C of the multi-stack semiconductor device 80 of FIG. 8. The gate dielectric layer 210 may be formed in the open space provided by removing the dummy gate structure 130, of the sacrificial layers 110S, 120S and the sacrificial isolation layers 115S included in the multi-stack semiconductor device 70 of FIG. 7.

FIG. 9A shows that the interfacial layer IL is first formed on the outer surfaces of the channel layers 110C, 120C and the channel isolation layers 115C of the multi-stack semiconductor device 80, and then, the high-k dielectric layer HK is formed on the interfacial layer IL.

The interfacial layer IL may be provided to protect the channel layers 110C and 120C, facilitate growth of the high-k layer HK thereon, and provide a necessary characteristic interface with the channel layers 110C and 120C as the channel structures of the multi-stack semiconductor device 90. The high-k layer HK may be provided to allow an increased gate capacitance without associated current leakage at the channel layers 110C and 120C.

The high-k layer HK may include a metal oxide material and/or one or more of high-k materials such as hafnium (Hf), aluminum (Al), zirconium (Zr), lanthanum (La), magnesium (Mg), barium (Ba), titanium (Ti), and lead (Pb), not being limited thereto, having a dielectric constant value greater than 7. A material forming the interfacial layer IL may be an oxide material such as silicon oxide (SiO), silicon dioxide ($SiO_2$), and/or silicon oxynitride (SiON), not being limited thereto. Thus, according to an embodiment, a portion of each of the channel layers 110C, 120C and the channel isolation layers 115C at the outer surfaces thereof may be removed through oxidization by the oxide interfacial layer IL.

According to an embodiment, as shown in FIG. 9B, when the oxide interfacial layer IL is formed to surround the channel layers 110C and 120C, the channel isolation layers 115C may be entirely removed by oxidization, that is, entirely oxidized at portions thereof that are positioned vertically under or on the interfacial layers IL or contact the interfacial layers IL. This is at least because each of the channel isolation layers 115C is very thin, according to an embodiment. As described earlier, the thickness TH3 of the channel isolation layers 115C, which may include Si, may be 2 nm or less as shown in FIGS. 1A and 1B, and thus, the channel isolation layers 115C may not endure the oxidization by the interfacial layer IL surrounding the channel isolation layers 115C. However, at least some side portions of the channel isolation layers 115C which are not surrounded by the interfacial layer IL may endure the oxidation because these side portions may be positioned vertically between the middle inner spacers formed at the side surfaces of the isolation structure 10I but not vertically below or above the interfacial layer IL so that they may not be exposed to the oxidation by the interfacial layer IL.

Thus, the channel isolation layers 115C between the lower channel structure 10L and the upper channel structure 10U may not exist in the multi-stack semiconductor device 90B shown in FIG. 9B, while the channel isolation layers 115C remain between the lower channel structure 10L and the upper channel structure 10U in the multi-stack semiconductor device 90A shown in FIG. 9A. According to an embodiment, the channel isolation layers 115C may be identified in the isolation structure 10I by its characteristics of being parallel with the channel layers 110C and 120C.

Here, it is understood that the steps of this method of manufacturing the multi-stack semiconductor device herebelow are based on the structure of the multi-stack semiconductor device 90A shown in FIG. 9A. However, it is also understood that these steps may also apply to the alternative structure of the multi-stack semiconductor device 90B shown in FIG. 9B.

Figure 10A:
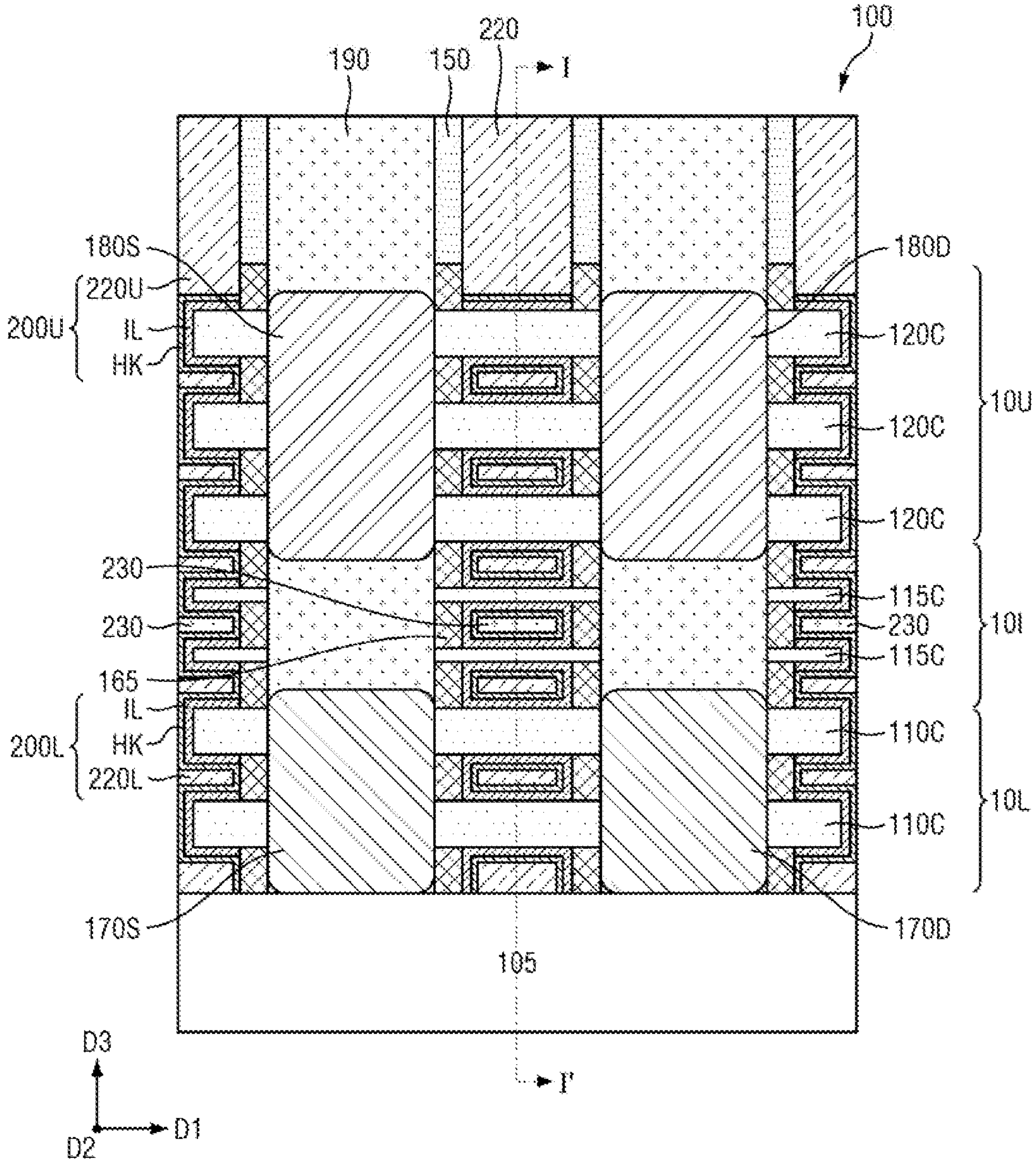
Figure 10B:
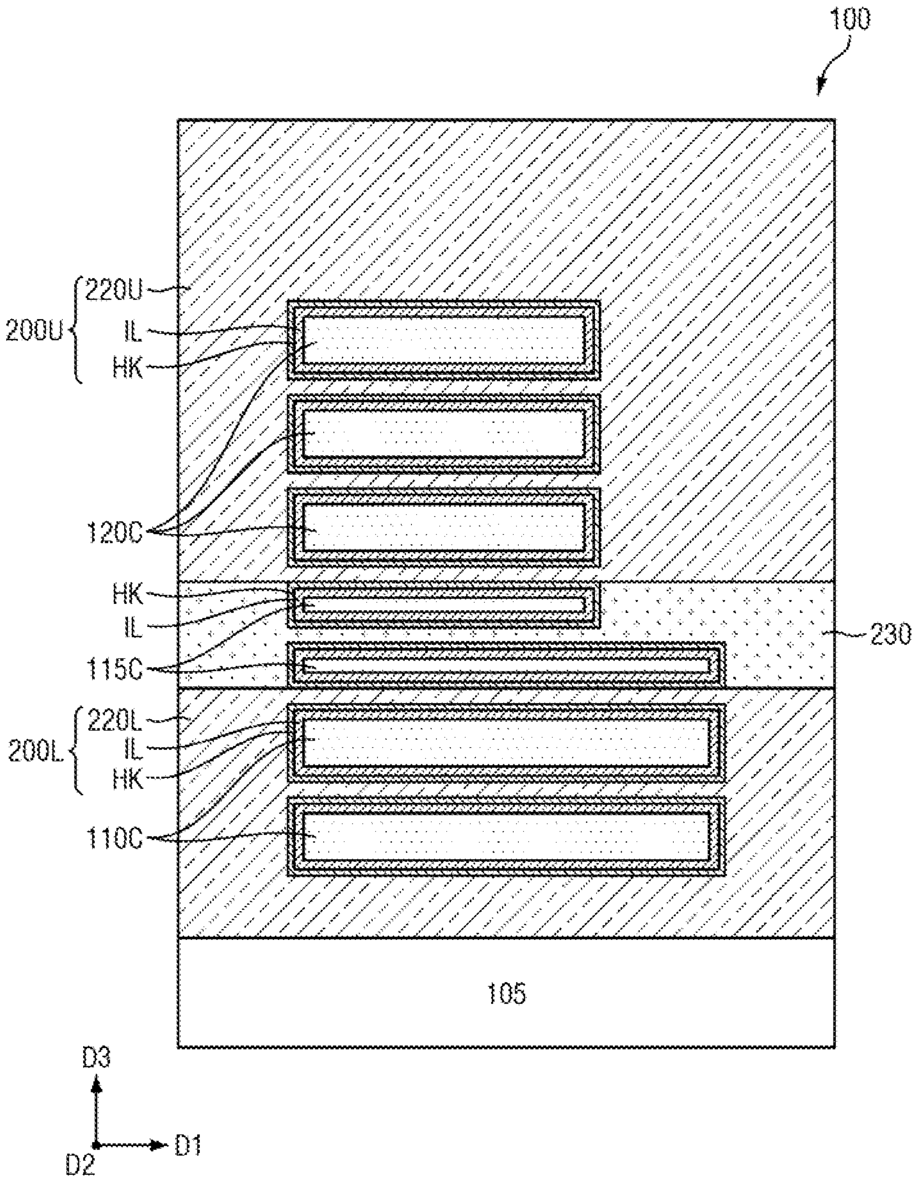

FIG. 10A illustrates a channel-length cross-section view of a multi-stack semiconductor device in which a gate structure is completed to surround channel layers, according to an embodiment. FIG. 10B illustrates a channel-width cross-section view of the multi-stack semiconductor device of FIG. 10A taken along line I-I' shown in FIG. 10A, according to an embodiment.

After the gate dielectric layer 210 including the interfacial layer IL and the high-k layer is formed on the lower and upper channel layers 110C, 120C and the channel isolation layers 115C, lower and upper gate metal patterns 220 are formed on the gate dielectric layer 210 to complete lower and upper gate structures 200L, 200U, respectively, for a multi-stack semiconductor device 100. Since the gate structures 200L and 200U have replaced the dummy gate structure 130 and the sacrificial layers 110S, 120S in the multi-stack semiconductor device 70 shown in FIG. 7, it may be referred to as a replacement metal gate (RMG).

Each of the lower and upper gate metal patterns 220L, 220U may include a work-function metal layer and a conductor layer. The work-function metal layer may be formed of titanium (Ti), tantalum (Ta) or their compound such as TIN, TiAl, TiAlN, TaN, TiC, TaC, TiAlC, TaCN, TaSiN, and/or a combination thereof, not being limited thereto, to modulate a desired threshold voltage for each of the gate structures 200L and 200U of the multi-stack semiconductor device 100. The conductor layer may be formed of copper (Cu), Al, tungsten (W), molybdenum (Mo), ruthenium (Ru), cobalt (Co) or their compound, not being limited thereto, to receive an input voltage for the multi-stack semiconductor device 100 or for an internal routing of the multi-stack semiconductor device 100 to an adjacent circuit.

Referring to FIGS. 10A an 10B, the lower gate metal pattern 220L may be formed first on the gate dielectric layer 210 surrounding the lower channel layers 110C to obtain the lower gate structure 200L, and another ILD structure 230 may be formed surrounding the oxidized channel isolation layers 115C with the interfacial layer IL and the high-k layer HK thereon, and then, the upper gate metal pattern 220U may be formed on the gate dielectric layer 210 surrounding the upper channel layers 120C to obtain the upper gate structure 200U, according to an embodiment.

However, in the case that the channel isolation layers 115C are entirely oxidized as shown in FIG. 9B, the lower gate metal pattern 220L may be formed first on the gate dielectric layer 210 surrounding the lower channel layers 110C, and another ILD structure 230 may be formed surrounding the high-k layer HK surrounding the interfacial layer IL, and then, the upper gate metal pattern 220U may be formed on the gate dielectric layer 210 surrounding the upper channel layers 120C, according to an embodiment.

Through the formation of the gate structures 200L and 200U as above, the multi-stack semiconductor device 100 is formed of a lower-stack nanosheet transistor including the lower channel structure 10L, the lower gate structure 200L and the lower source/drain regions 170S, 170D, and an upper-stack nanosheet transistor including the upper channel structure 200U, the upper gate structure 200U and the upper source/drain regions 180S, 180D.

FIG. 11A illustrates a multi-stack semiconductor device in which lower and upper source/drain region contact structures are connected to lower and upper source/drain regions, respectively, according to an embodiment. FIG. 11B illustrates a channel-width cross-section view of the multi-stack semiconductor device of FIG. 11A taken along line I-I' shown in FIG. 11A, according to an embodiment.

Referring to FIGS. 11A and 11B, upper source/drain region contact structures 180SC and 180DC are connected to the upper source/drain regions 180S and 180D, respectively, and a lower source/drain region contact structure 170SC is connected to the lower source/drain region 170S in the multi-stack semiconductor device 100 of FIGS. 10A and 10B. Although not shown another lower source/drain region contact structure may be connected to the lower source/drain region 170D.

The source/drain region contact structures 170SC, 180SC and 180DC may be formed by dry etching and/or wet etching, not being limited thereto, on the ILD structure 190 of the multi-stack semiconductor device 100. The source/drain region contact structures 170SC, 180SC and 180DC may include a conductor metal such as copper (Cu), cobalt (Co), tungsten (W), ruthenium (Ru), or a combination thereof, not being limited thereto.

FIG. 11B shows that a width of the upper source/drain region 180S is smaller than that of the lower source/drain region 170S. This is because, as described in reference to FIGS. 1B and 10B, the upper channel structure 10U has a smaller channel with than the lower channel structure 10L, and thus, the upper source/drain region 180S is epitaxially grown from the upper channel structure 10U smaller than the lower channel structure 10L from which the lower source/drain region 170S is epitaxially grown.

Thus far, a method of manufacturing a multi-stack semiconductor device in which inner spacers are formed using an isolation structure that include thin isolation layers such as Si forming in nanosheet channel layers. As discussed, the thin Si isolation layers may provide a stable isolation structure between lower and upper channel structures of the multi-stack semiconductor device which may overcome the problems of an isolation structure formed of a single SiGe layer of a plurality of SiGe layers having different Ge concentrations.

The isolation layers and the inner spacers according to the embodiments described herein are based on the multi-stack semiconductor device including a lower nanosheet transistor with two channel layers having a greater channel width and an upper nanosheet transistor with three channel layers having a smaller channel width. However, the embodiments may also apply to a multi-stack semiconductor device having two or more nanosheet transistors vertically stacked and having more or less than two lower channel layers and three upper channel layers having different channel widths, or having the same number of lower and upper channel layers having the same channel width.

Figure 12:
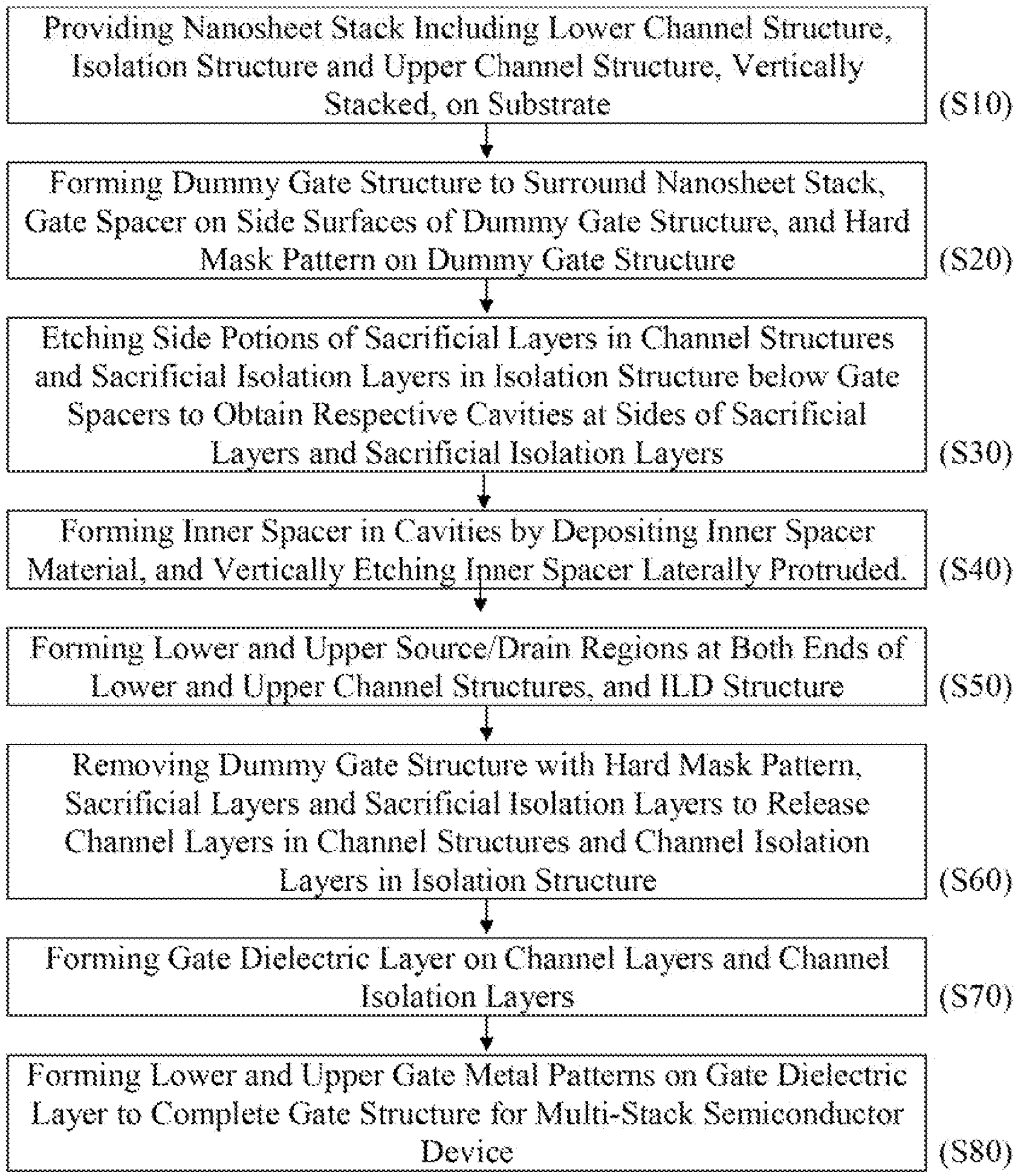
FIG. 12 illustrates a flowchart describing a method of manufacturing a multi-stack semiconductor device described above in reference to FIGS. 1A and 1B to FIGS. 11A and 11B, according to an embodiment.

FIG. 12 illustrates a flowchart describing a method of manufacturing a multi-stack semiconductor device described above in reference to FIGS. 1A and 1B to FIGS. 11A and 11B, according to an embodiment.

In operation S10, a nanosheet stack including a lower channel structure, an isolation structure and a upper channel structure are vertically stacked is provided on a substrate. See FIGS. 1A and 1B.

The isolation structure may include two or more sacrificial isolation layers, formed of the same material, e.g., SiGe, of sacrificial layers included in the channel structures, and one or more channel isolation layers formed of the same material, e.g., Si, of channel layers of the channel structures.

The nanosheet stack may be formed by epitaxially growing nanosheet layers one layer and then next in the following order: a sacrificial layer, a channel layer, a sacrificial layer, a channel layer, a sacrificial isolation layer, a channel isolation layer, a sacrificial isolation layer, a channel isolation layer, a sacrificial isolation layer, a channel layer, a sacrificial layer, a channel layer, a sacrificial layer, a channel layer, and a sacrificial layer.

Each of the channel isolation layers may be thinner than each of the channel layers, and thus, it may be entirely oxidized when layered or exposed to an oxide layer in a later step of manufacturing the multi-stack semiconductor device. For example, each of the channel layers may have a thickness ranging 8 nm to 13 nm, while the channel isolation layers may have a thickness of 2 nm or less.

In operation S20, a dummy gate structure may be formed to surround the nanosheet stack across the channel width direction, and a gate spacer may be formed on side surfaces of the dummy gate structure. Further, a hard mask pattern used to pattern the dummy gate structure may remain on a top surface of the dummy gate structure. See FIGS. 2A, 2B and 3.

The dummy gate structure with the hard mask pattern and the gate spacer thereon are to be used as a mask structure to divide the nanosheet stack into a plurality of nanosheet stacks, and form inner spacers of the lower and upper nanosheet transistors of the multi-stack semiconductor device in subsequent steps. The dummy gate structure may include an amorphous silicon or amorphous carbon, and the gate spacer may include SiN, SiCN or SiOCN, not being limited thereto.

In operation S30, side portions of sacrificial layers and sacrificial isolation layers below gate spacers may be removed from the nanosheet stack by, for example, selective etching to obtain respective cavities at sides of the sacrificial layers and the sacrificial isolation layers, for inner spacer formation therein at a later step. See FIG. 4.

This selective etching operation may attack an SiGe or Ge component without affecting the channel layers and channel isolation layers, and thus, a length of each of the sacrificial layers and the sacrificial isolation layers may be reduced by a width of the gate spacer in the channel-length direction.

In operation S40, inner spacer may be formed in the cavities obtained from the previous operation by depositing an inner spacer material and subsequent etching operation. See FIGS. 5A and 5B.

The inner spacers may be formed by conformally depositing the inner spacer material such as SiN, SiO, SiON, SiOC, SiBCN, SiOCN and/or SiC, not being limited thereto, in the cavities, and then, a reactive ion etching may be performed on the deposited inner spacer material.

Due to these deposition and etching operations, side surfaces of the inner spacers, the channel layers and the channel isolation layers may all vertically coplanar on the substrate (FIG. 5A). However, due to the very thin thickness of the channel isolation layers and the conformal deposition, for example, by atomic layer deposition (ALD), the inner spacer material may remain on the side surfaces of the channel isolation layers after the etching operation is applied subsequent to the conformal deposition (FIG. 5B).

In operations S50, lower and upper source/drain regions may be formed at both ends of the lower and upper channel structures to connect the channel layers of the lower and upper channel structures, respectively, and an ILD structure is formed in the nanosheet stack at least to isolate these source/drain regions from each other or from other circuit elements. See FIGS. 6 and 7.

The lower and upper source/drain regions may be epitaxially grown from the channel layers of the lower and upper channel structures, and thus, they may include a material(s) similar to that included in the channel layers. However, these source/drain regions may be isolated from the sacrificial layers and by the inner spacers. The ILD structure may include SiO or $SiO_2$, not being limited thereto.

The lower source/drain regions may be doped with one or more n-type dopants, and the upper source/drain regions may be doped with one or more p-type dopants, for example.

In operation S60, the dummy gate structure with the hard mask pattern thereon, the sacrificial layers and the sacrificial isolation layers are removed from a multi-stack semiconductor device obtained in the previous operation to release the channel layers and the channel isolation layers. See FIG. 8.

This removal operation may be performed through isotropic and/or anisotropic reactive ion etching (RIE), wet etching and/or a chemical oxide removal (COR) process, not being limited thereto.

In operation S70, a gate dielectric layer including an interfacial layer and a high-k layer may be formed on channel layers and channel isolation layers to surround the channel layers and the channel isolation layers. See FIGS. 9A and 9B.

A material forming the interfacial layer may be an oxide material such as SiO, $SiO_2$ and/or SiON, and the high-k layer HK may include a metal oxide material and/or one or more of high-k materials such as Hf, Al, Zr, La, Mg, Ba, Ti and Pb, not being limited thereto.

In this operation, the oxide interfacial layer IL may be formed to surround the channel layers and the channel isolation layers (FIG. 9A), the channel isolation layers may be entirely removed by oxidization because the channel isolation layers is very thin (FIG. 9B).

In operation S80, lower and upper gate metal patterns are formed on the gate dielectric layer to complete a gate structure for a multi-stack semiconductor device.

Each of the lower and upper gate metal patterns may include a work-function metal layer and a conductor layer. The work-function metal layer may be formed of Ti, Ta or their compound such as TIN, TiAl, TiAlN, TaN, TIC, TaC, TiAlC, TaCN, TaSiN, and/or a combination thereof, not being limited thereto. The conductor layer may be formed of Cu, Al, W, Mo, Ru or their compound, not being limited thereto.

Figure 13:
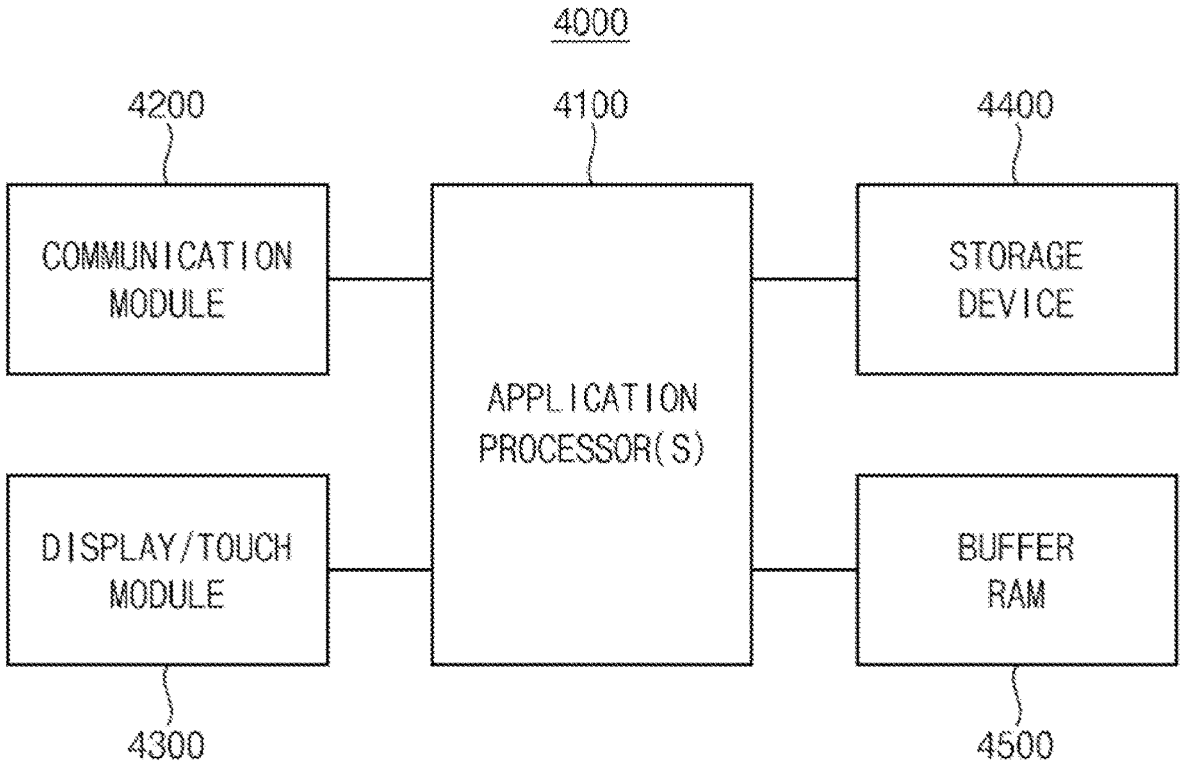
FIG. 13 is a schematic block diagram illustrating an electronic device including a multi-stack semiconductor device, according to an example embodiment.

FIG. 13 is a schematic block diagram illustrating an electronic device including a multi-stack semiconductor device having an improved isolation structure between lower and upper channel structures and inner spacers formed based on the isolation structure, according to an example embodiment.

Referring to FIG. 13, an electronic device 4000 may include at least one application processor 4100, a communication module 4200, a display/touch module 4300, a storage device 4400, and a buffer RAM 4500. The electronic device 4000 may be a mobile device such as a smartphone or a tablet computer, not being limited thereto, according to embodiments.

The application processor 4100 may control operations of the electronic device 4000. The communication module 4200 is implemented to perform wireless or wire communications with an external device. The display/touch module 4300 is implemented to display data processed by the application processor 4100 and/or to receive data through a touch panel. The storage device 4400 is implemented to store user data. The storage device 4400 may be an embedded multimedia card (eMMC), a solid state drive (SSD), a universal flash storage (UFS) device, etc. The storage device 4400 may perform caching of the mapping data and the user data as described above.

The buffer RAM 4500 may temporarily store data used for processing operations of the electronic device 4000. For example, the buffer RAM 4500 may be volatile memory such as double data rate (DDR) synchronous dynamic random access memory (SDRAM), low power double data rate (LPDDR) SDRAM, graphics double data rate (GDDR) SDRAM, Rambus dynamic random access memory (RDRAM), etc.

At least one component in the electronic device 4000 may include at least one of the multi-stack semiconductor devices including the inner spacer and the isolation structure described above in reference to FIGS. 1A and 1B to 12A to 12C.

The foregoing is illustrative of exemplary embodiments and is not to be construed as limiting the disclosure. Although a few exemplary embodiments have been described, those skilled in the art will readily appreciate that many modifications are possible in the above embodiments without materially departing from the disclosure.

What is claimed is:

1. A multi-stack semiconductor device comprising:
- a substrate;
- a lower nanosheet transistor comprising:
  - a lower channel structure;
  - a lower gate structure surrounding the lower channel structure, and comprising a gate dielectric layer;
  - lower source/drain regions at both ends of the lower channel structure; and
  - at least one lower inner spacer isolating the lower source/drain regions from the lower gate structure;
- an upper nanosheet transistor, on the lower nanosheet transistor, comprising:
  - an upper channel structure;
  - an upper gate structure surrounding the upper channel structure, and comprising the gate dielectric layer;
  - upper source/drain regions at both ends of the upper channel structure; and
  - at least one upper inner spacer isolating the upper source/drain regions from the upper gate structure; and
- an isolation structure between the lower and upper channel structures, wherein a spacer structure comprising a same material forming the lower or upper inner spacer is formed at a side of the isolation structure, wherein the isolation structure comprises at least one semiconductor layer formed of a material having an etch selectivity which is the same as an etch selectivity of at least one of the lower and upper channel structures, wherein the at least one semiconductor layer comprises a plurality of isolation layers, and wherein the spacer structure is at a lateral side of each of the isolation layers.

2. The multi-stack semiconductor device of claim 1, wherein the at least one semiconductor layer has a same material component as at least one of the upper and lower channel structures.

3. The multi-stack semiconductor device of claim 1, wherein the at least one semiconductor layer is extended in parallel with the lower and upper channel structures.

4. The multi-stack semiconductor device of claim 3, wherein at least one of the lower and upper channel structures comprises at least one nanosheet layer, and wherein each of the at least one semiconductor layer is thinner than a nanosheet layer among the at least one nanosheet layer.

5. The multi-stack semiconductor device of claim 4, wherein the at least one semiconductor layer comprises a plurality of semiconductor layers.

6. The multi-stack semiconductor device of claim 5, wherein at least one of the lower and upper channel structures comprises a plurality of nanosheet layers, and wherein each of the semiconductor layers is thinner than each of the nanosheet layers.

7. The multi-stack semiconductor device of claim 1, wherein a material component of the plurality of isolation layers is different from a material component of the at least one of the lower and upper channel structures.

8. The multi-stack semiconductor device of claim 1, wherein the spacer structure is vertically below the at least one lower inner spacer.

9. The multi-stack semiconductor device of claim 8, wherein the spacer structure vertically connects the isolation layers.

10. The multi-stack semiconductor device of claim 1, wherein the isolation structure comprises at least a portion of the gate dielectric layer.

11. A multi-stack semiconductor device comprising:

a substrate;

a lower nanosheet transistor comprising:

a lower channel structure;

a lower gate structure surrounding the lower channel structure;

lower source/drain regions at both ends of the lower channel structure; and at least one lower inner spacer isolating the lower source/drain regions from the lower gate structure;

an upper nanosheet transistor, on the lower nanosheet transistor, comprising:

an upper channel structure;

an upper gate structure surrounding the upper channel structure;

upper source/drain regions at both ends of the upper channel structure; and at least one upper inner spacer isolating the upper source/drain regions from the upper gate structure; and an isolation structure between the lower and upper channel structures, wherein the isolation structure comprises at least a portion of a gate dielectric layer included in the lower and upper gate structures and at least one isolation layer having a same length as at least one of the lower and upper channel structures, and wherein the isolation layer has a material component different from a material component of the at least one of the lower and upper channel structures.

12. The multi-stack semiconductor device of claim 11, wherein a spacer structure comprising a same material forming the lower or upper inner spacer is formed at a side of the isolation structure.

13. The multi-stack semiconductor device of claim 12, wherein at least one of the lower and upper channel structures comprises at least one nanosheet layer, and wherein each of the at least one isolation layer is thinner than a nanosheet layer among the at least one nanosheet layer.

14. The multi-stack semiconductor device of claim 13, wherein the at least one isolation layer comprises a plurality of isolation layers, and wherein the spacer structure is at a side of each of the isolation layers.

15. The multi-stack semiconductor device of claim 12, wherein the at least one isolation layer comprises a plurality of isolation layers, and wherein the spacer structure is at a side of each of the isolation layers.

16. The multi-stack semiconductor device of claim 15, wherein the spacer structure is vertically below the at least one lower inner spacer.

17. The multi-stack semiconductor device of claim 16, wherein the spacer structure vertically connects the isolation layers.

18. A multi-stack semiconductor device comprising:

a substrate;

a lower nanosheet transistor comprising:

a lower channel structure;

a lower gate structure surrounding the lower channel structure;

lower source/drain regions at both ends of the lower channel structure; and at least one lower inner spacer isolating the lower source/drain regions from the lower gate structure;

an upper nanosheet transistor, on the lower nanosheet transistor in a first direction, and comprising:

an upper channel structure;

an upper gate structure surrounding the upper channel structure;

upper source/drain regions at both ends of the upper channel structure; and at least one upper inner spacer isolating the upper source/drain regions from the upper gate structure; and an isolation structure between the lower and upper channel structures, wherein the isolation structure comprises at least a portion of a gate dielectric layer included in the lower and upper gate structures and at least one isolation layer that is between the at least one lower inner spacer and the at least one upper inner spacer in the first direction, wherein the at least one isolation layer is disconnected in a second direction by the gate dielectric layer in a portion of the isolation structure that is between the lower gate structure and the upper gate structure in the first direction, wherein the second direction intersects the first direction, and wherein the isolation layer comprises a material component different from a material component of at least one of the lower and upper channel structures.

19. The multi-stack semiconductor device of claim 18, wherein the at least one isolation layer is disconnected in the second direction by an interfacial layer included in the gate dielectric layer, and wherein the interfacial layer comprises silicon oxide or silicon oxynitride.

20. The multi-stack semiconductor device of claim 18, wherein the at least one isolation layer comprises a material having an etch selectivity which is the same as an etch selectivity of the lower and upper channel structures.

* * * * *